US012588281B2

(12) United States Patent　　　　(10) Patent No.:　US 12,588,281 B2
Yang et al.　　　　　　　　　　　(45) Date of Patent:　Mar. 24, 2026

(54) DISPLAY APPARATUS COMPRISING THIN FILM TRANSISTOR

(71) Applicant: LG DISPLAY CO., LTD., Seoul (KR)

(72) Inventors: JeongSuk Yang, Paju-si (KR); Sunggu Kim, Paju-si (KR)

(73) Assignee: LG Display Co., Ltd. (KR)

( * ) Notice:　Subject to any disclaimer, the term of this patent is extended or adjusted under 35 U.S.C. 154(b) by 18 days.

(21) Appl. No.: 18/204,004

(22) Filed:　May 31, 2023

(65) Prior Publication Data

US 2023/0307468 A1　　Sep. 28, 2023

Related U.S. Application Data

(62) Division of application No. 17/122,915, filed on Dec. 15, 2020, now Pat. No. 11,705,465.

(30) Foreign Application Priority Data

Dec. 16, 2019　(KR) ........................ 10-2019-0167721

(51) Int. Cl.
H10D 86/01　　　(2025.01)
H10D 86/40　　　(2025.01)
　　　　(Continued)

(52) U.S. Cl.
CPC ..... H10D 86/0231 (2025.01); H10D 86/0221 (2025.01); H10D 86/423 (2025.01);
　　　　(Continued)

(58) Field of Classification Search
CPC ............ H01L 27/1288; H01L 27/1225; H01L 27/1255; H01L 27/127; H10K 71/00; H10K 59/1213
　　　　(Continued)

(56) References Cited

U.S. PATENT DOCUMENTS 9,460,656 B2　10/2016　Shim et al.
2003/0207482 A1 *　11/2003　Lu .......................... H10D 86/00
　　　　　　　　　　　　　　438/149
　　　　(Continued)

FOREIGN PATENT DOCUMENTS

CN　　　1607432 A　　4/2005
CN　　109887952 A　　6/2019
　　　　(Continued)

OTHER PUBLICATIONS

Chinese Office Action dated Nov. 13, 2023 issued in Patent Application No. 202011439425.4 (7 pages).
　　　　(Continued)

*Primary Examiner* — Ori Nadav
(74) *Attorney, Agent, or Firm* — Fish & Richardson P.C.

(57)　　　　ABSTRACT
A display apparatus comprises a first signal line on a substrate, a second signal line intersecting with the first signal line, a first gate electrode, a first source electrode, a first drain electrode, and a second gate electrode disposed on the same layer as that of the first signal line, a first active layer spaced apart from the first gate electrode and partially overlapped with the first gate electrode, a second active layer spaced apart from the second gate electrode and partially
　　　　(Continued)

overlapped with the second gate electrode, and a first electrode of a display device connected with the second active layer.

18 Claims, 27 Drawing Sheets

(51) Int. Cl.
| | | |
|---|---|---|
| *H10D 86/60* | (2025.01) | |
| *H10K 59/121* | (2023.01) | |
| *H10K 59/131* | (2023.01) | |
| *H10K 59/12* | (2023.01) | |
| *H10K 71/00* | (2023.01) | |

(52) U.S. Cl.
CPC ........... *H10D 86/481* (2025.01); *H10D 86/60* (2025.01); *H10K 59/1213* (2023.02); *H10K 59/131* (2023.02); *H10K 59/1201* (2023.02); *H10K 71/00* (2023.02)

(58) Field of Classification Search
USPC ........................................................ 257/43
See application file for complete search history.

(56) References Cited

U.S. PATENT DOCUMENTS

| | | | |
|---|---|---|---|
| 2004/0004222 A1 | 1/2004 | Ahn | |
| 2016/0043152 A1 | 2/2016 | Tian et al. | |
| 2016/0300528 A1 | 10/2016 | Kong et al. | |
| 2017/0027803 A1 | 2/2017 | Agrawal et al. | |
| 2017/0227803 A1* | 8/2017 | Chen | H01L 27/1259 |
| 2018/0175116 A1* | 6/2018 | Song | G06F 3/0412 |
| 2019/0006390 A1 | 1/2019 | Park | |

FOREIGN PATENT DOCUMENTS

| | | | |
|---|---|---|---|
| KR | 10-2009-0058283 A | 6/2009 | |
| KR | 20100116876 A | 11/2010 | |
| KR | 20140140984 A | 12/2014 | |
| KR | 20150100566 A | 9/2015 | |
| KR | 20170126556 A | 11/2017 | |

OTHER PUBLICATIONS

Office Action in Korean Appln. No. 20190167721, mailed on Feb. 18, 2025, 26 pages (with English translation).

* cited by examiner

FIG. 14B

DISPLAY APPARATUS COMPRISING THIN FILM TRANSISTOR

CROSS REFERENCE TO RELATED APPLICATIONS

This application is a divisional of U.S. patent application Ser. No. 17/122,915, filed on Dec. 15, 2020, which claims the benefit of the Korean Patent Application No. 10-2019-0167721 filed on Dec. 16, 2019, which are hereby incorporated by reference in their entirety for all purposes as if fully set forth herein.

BACKGROUND

Field of the Disclosure

The present disclosure relates to a display apparatus and a method for manufacturing the same. In more detail, the present disclosure relates to a display apparatus capable of simplifying a structure and a manufacturing process, and a method for manufacturing the same.

Description of the Background

A display apparatus which displays various information on a screen is a technology-intensive device in which core technologies of an information communication field are integrated. Recently, the display apparatus has been developed so as to realize thin profile, lightness, portability, and furthermore, high performance. Typical examples of the display apparatus may be a liquid crystal display (LCD) device and an organic light emitting diode display (OLED) device.

Generally, a mask process using a photo mask is carried out several times so as to manufacture the display apparatus. Each mask process requires cleaning, exposure, developing and etching steps, or the like. Accordingly, whenever one mask process is added, it may cause the increase of manufacturing time and cost, and furthermore, it may cause the increase of possibility of defect and defect rate. As a result, a manufacturing yield is lowered. Thus, in order to lower a manufacturing cost, and to improve a production yield and efficiency, it is necessary to simplify a structure and a manufacturing process.

SUMMARY

Accordingly, the present disclosure has been made in view of the above problems, and to provide a display apparatus capable of simplifying a structure and a manufacturing process, and a method for manufacturing the same.

The present disclosure is also to provide a thin film transistor with a simplified structure and manufacturing process, and a display apparatus comprising the thin film transistor, in which the thin film transistor has a bottom gate structure using an oxide semiconductor material, and thus it is possible to omit a light shielding layer and a process of forming source and drain electrodes.

Further, the present disclosure is to provide a method for manufacturing a display apparatus comprising a thin film transistor with a simplified structure and manufacturing process.

In accordance with an aspect of the present disclosure, the above and other features can be accomplished by the provision of a display apparatus comprising a first signal line on a substrate, a second signal line intersecting with the first signal line, a first gate electrode, a first source electrode, a first drain electrode, and a second gate electrode disposed on the same layer as that of the first signal line, a first active layer spaced apart from the first gate electrode and partially overlapped with the first gate electrode, a second active layer spaced apart from the second gate electrode and partially overlapped with the second gate electrode, and a first electrode of a display device connected with the second active layer, wherein the second signal line includes a first portion and a second portion disposed on the same layer as that of the first signal line, and spaced apart from each other with the first signal line therebetween, and a first connection electrode configured to connect the first portion and the second portion with each other, the first gate electrode is connected with any one of the first signal line and the second signal line, any one of the first source electrode and the first drain electrode is connected with the second gate electrode, and the other of the first source electrode and the first drain electrode is connected with the other of the first signal line and the second signal line.

Any one of the first signal line and the second signal line is a gate line, and the other is a data line.

Any one of the first source electrode and the first drain electrode is formed as one body with the second gate electrode.

A gate insulating film is disposed on the first gate electrode, the first source electrode, the first drain electrode, and the second gate electrode, and the first active layer is disposed on the gate insulating film, and the first active layer contacts the first source electrode and the first drain electrode via contact holes formed in the gate insulating film.

The first active layer includes a channel region, and a source region and a drain region connected with the channel region, wherein the source region contacts the first source electrode, and the drain region contacts the first drain electrode.

The source region and the drain region are formed by a process of providing conductivity to an oxide semiconductor layer.

The first connection electrode and the first electrode of the display device are manufactured at the same time by the same mask process.

The first connection electrode includes a transparent conductive oxide layer formed of the same material as that of the first electrode of the display device, and a metal layer on the transparent conductive oxide layer.

The first gate electrode is disposed between the substrate and the first active layer, and the second gate electrode is disposed between the substrate and the second active layer.

Each of the first active layer and the second active layer includes an oxide semiconductor material.

The first active layer includes a first oxide semiconductor layer on the first gate electrode, and a second oxide semiconductor layer on the first oxide semiconductor layer.

The second active layer includes a first oxide semiconductor layer on the second gate electrode, and a second oxide semiconductor layer on the first oxide semiconductor layer.

The display apparatus further comprises a first capacitor electrode disposed on the same layer as that of the second gate electrode.

The first capacitor electrode is formed as one body with the second gate electrode.

The first capacitor electrode is overlapped with the first electrode of the display device, to thereby form a first capacitor.

The display apparatus further comprises a second capacitor electrode, a second source electrode and a second drain electrode, wherein the second capacitor electrode is connected with any one of the second source electrode and the second drain electrode.

The second capacitor electrode is formed as one body with the second active layer.

The display apparatus further comprises a third signal line which intersects with any one of the first signal line and the second signal line.

The third signal line is a driving power line.

In accordance with another aspect of the present disclosure, there is provided a method for manufacturing a display apparatus comprising providing a first signal line, a first gate electrode, a first source electrode, a first drain electrode, a second gate electrode, and a first portion and a second portion of a second signal line on a substrate, providing a gate insulating film on the first signal line, the first gate electrode, the first source electrode, the first drain electrode, the second gate electrode, and the first portion and the second portion of the second signal line, providing a first active layer and a second active layer on the gate insulating film, wherein at least a portion of the first active layer is overlapped with the first gate electrode, and at least a portion of the second active layer is overlapped with the second gate electrode, selectively providing conductivity to the first active layer and the second active layer to make conducting regions in the first active layer and the second active layer, providing a protection layer on the first active layer and the second active layer, and providing a first connection electrode and a first electrode of a display device on the protection layer, wherein the first connection electrode connects the first portion of the second signal line with the second portion of the second signal line, the first gate electrode is connected with any one of the first signal line and the second signal line, any one of the first source electrode and the first drain electrode is connected with the second gate electrode, and the other of the first source electrode and the first drain electrode is connected with the other of the first signal line and the second signal line.

The process of selectively providing conductivity to the first active layer and the second active layer includes a doping process using dopant.

The process of providing the first connection electrode and the first electrode of the display device includes providing a transparent conductive oxide (TCO) layer on the protection layer, providing a metal layer on the transparent conductive oxide layer, and patterning the transparent conductive oxide layer and the metal layer, wherein the metal layer is removed from the area for the first electrode of the display device.

BRIEF DESCRIPTION OF THE DRAWINGS

The above and other features and other advantages of the present disclosure will be more clearly understood from the following detailed description taken in conjunction with the accompanying drawings.

In the drawings:

FIGS. 14A, 14B, 14C, 14D and 14E are respectively a plan view and cross sectional views for a manufacturing process of the display apparatus according to one aspect of the present disclosure;

DETAILED DESCRIPTION

Figure 1:
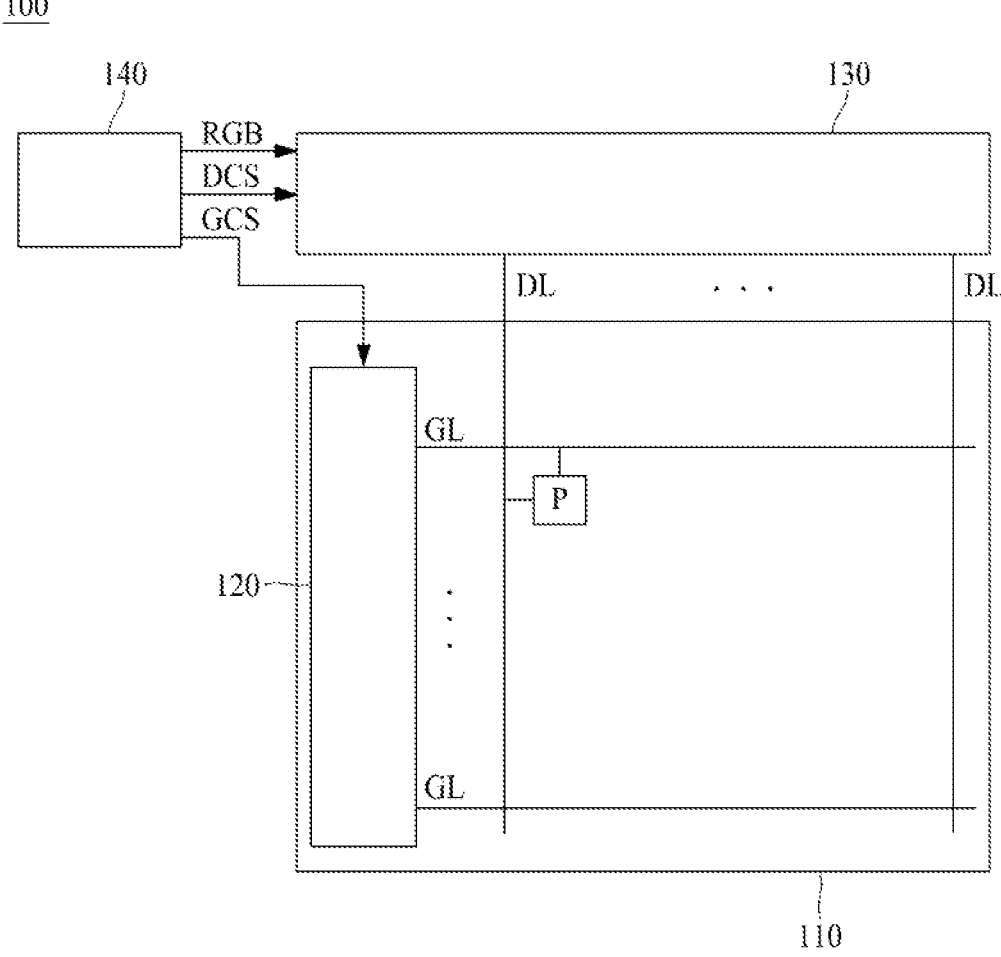
FIG. 1 is a schematic view illustrating a display apparatus according to one aspect of the present disclosure.

Advantages and features of the present disclosure, and implementation methods thereof will be clarified through the following aspects, described with reference to the accompanying drawings. The present disclosure may, however, be embodied in different forms and should not be construed as being limited to the aspects set forth herein. Rather, these aspects are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing aspects of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below," "beneath", and "next," the case of no contact therebetween may be included, unless "just" or "direct" is used.

If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in a co-dependent relationship.

In the drawings, the same or similar elements are denoted by the same reference numerals even though they are depicted in different drawings.

In the aspects of the present disclosure, a source electrode and a drain electrode are distinguished from each other, for convenience of explanation. However, the source electrode and the drain electrode are used interchangeably. Thus, the source electrode may be the drain electrode, and the drain electrode may be the source electrode. Also, the source electrode in any one aspect of the present disclosure may be the drain electrode in another aspect of the present disclosure, and the drain electrode in any one aspect of the present disclosure may be the source electrode in another aspect of the present disclosure.

In one or more aspects of the present disclosure, for convenience of explanation, a source region is distinguished from a source electrode, and a drain region is distinguished from a drain electrode. However, aspects of the present disclosure are not limited to this structure. For example, a source region may be a source electrode, and a drain region may be a drain electrode. Also, a source region may be a drain electrode, and a drain region may be a source electrode.

FIG. 1 is a schematic view illustrating a display apparatus 100 according to one aspect of the present disclosure.

As shown in FIG. 1, the display apparatus 100 according to one aspect of the present disclosure includes a display panel 110, a gate driver 120, a data driver 130, and a controller 140.

The display panel 110 includes gate lines (GL) and data lines (DL), and a pixel (P) which is arranged at a crossing portion of the gate line (GL) and the data line (DL). The pixel (P) includes a display device 710, and a pixel driver (PDC) configured to drive the display device 710. An image is displayed on the display panel 110 by driving the pixel (P).

The controller 140 controls the gate driver 120 and the data driver 130.

The controller 140 outputs a gate control signal (GCS) for controlling the gate driver 120, and a data control signal (DCS) for controlling the data driver 130 by the use of vertically/horizontally synchronized signal and clock signal supplied from an external system (not shown). Also, the controller 140 samples input video data, which is provided from the external system, and then re-aligns the sampled video data, and supplies the re-aligned digital video data (RGB) to the data driver 130.

The gate control signal (GCS) includes a gate start pulse (GSP), a gate shift clock (GSC), a gate output enable signal (GOE), a start signal (Vst), and a gate clock (GCLK). Also, control signals for controlling a shift register may be included in the gate control signal (GCS).

The data control signal (DCS) includes a source start pulse (SSP), a source shift clock signal (SSC), a source output enable signal (SOE), and a polarity control signal (POL).

The data driver 130 supplies a data voltage to the data lines (DL) of the display panel 110. In detail, the data driver 130 converts the video data (RGB) provided from the controller 140 into a data voltage, and supplies the data voltage to the data lines (DL).

The gate driver 120 sequentially supplies a gate pulse (GP) to the gate lines (GL) for 1 frame period. Herein, '1 frame' indicates the period in which one image is output through the use of display panel 110. Also, the gate driver 120 supplies a gate-off signal for turning off a switching device to the gate line (GL) for the remaining period of 1 frame in which the gate pulse (GP) is not supplied. Hereinafter, the gate pulse (GP) and the gate-off signal (Goff) are totally referred to as scan signals (SS).

According to one aspect of the present disclosure, the gate driver 120 may be provided on the display panel 110. A structure of directly providing the gate driver 120 on the display panel 110 may be referred to as Gate-In-Panel (GIP) structure.

Figure 2:
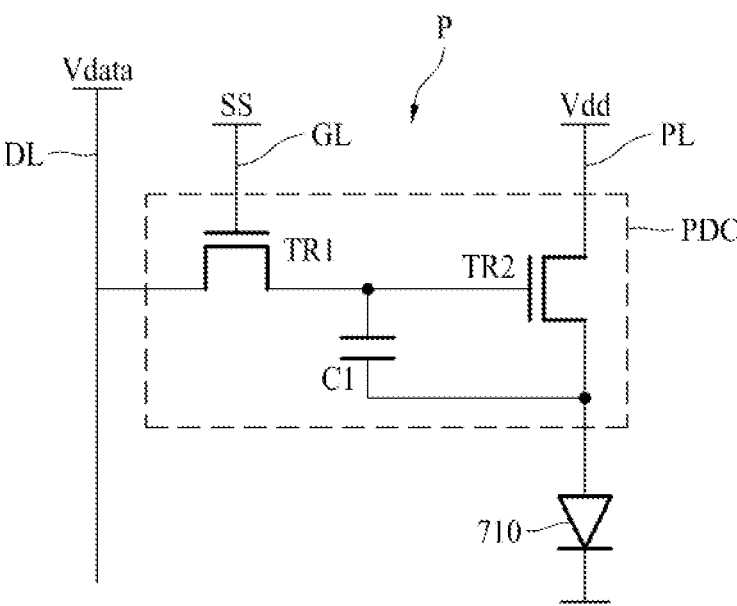
FIG. 2 is a circuit diagram for any one pixel of FIG. 1.
Figure 3:
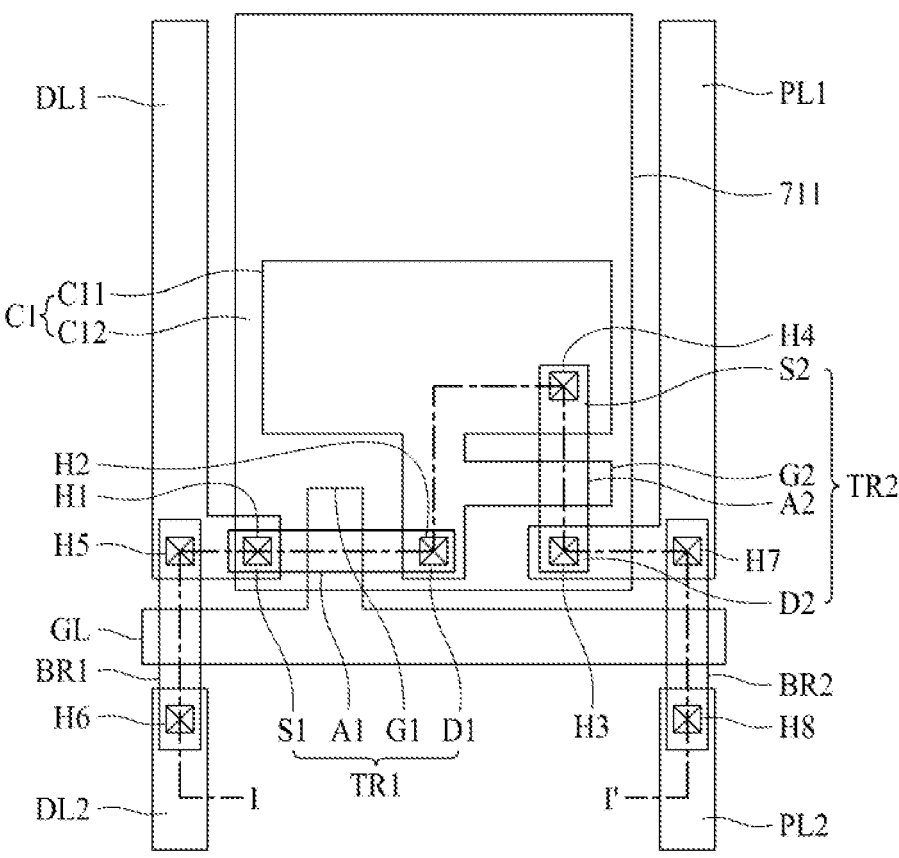
FIG. 3 is a plan view illustrating the pixel of FIG. 2.
Figure 4:
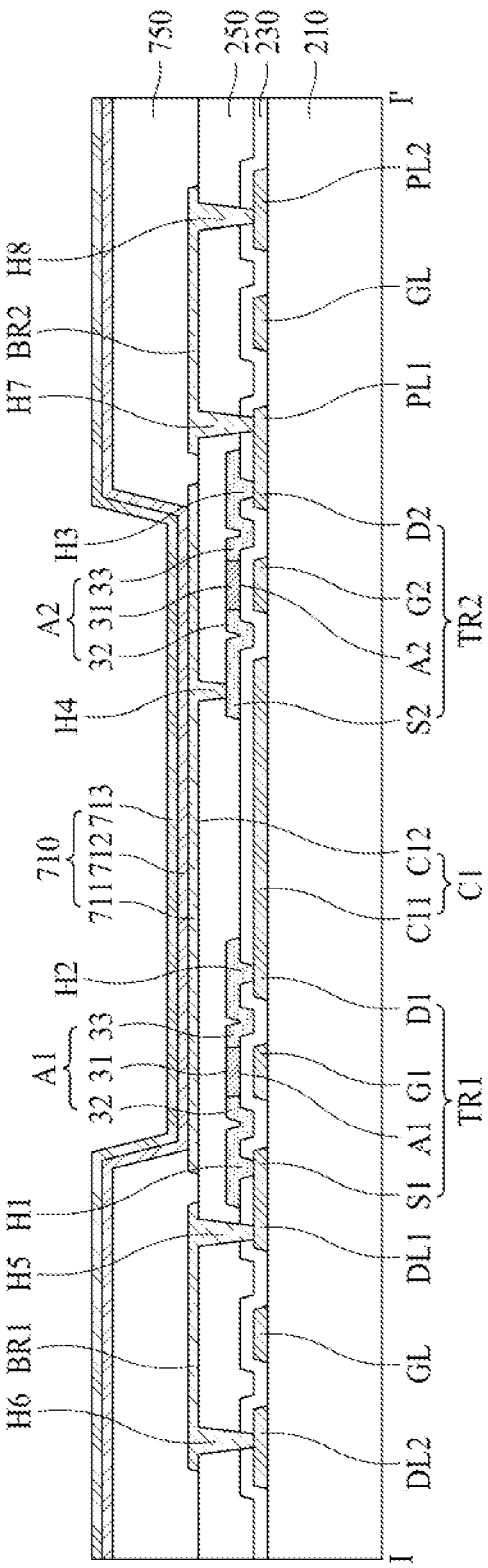
FIG. 4 is a cross sectional view along of FIG. 3.

FIG. 2 is a circuit diagram illustrating any one pixel (P) of FIG. 1, FIG. 3 is a plan view illustrating the pixel (P) of FIG. 2, and FIG. 4 is a cross sectional view along I-I' of FIG. 3.

Referring to FIGS. 2, 3 and 4, the display apparatus 100 according to one aspect of the present disclosure includes a substrate 210, a pixel driver (PDC) on the substrate 210, and a display device 710 connected with the pixel driver (PDC). The pixel driver (PDC) includes thin film transistors (TR1, TR2).

The circuit diagram of FIG. 2 corresponds to an equivalent circuit diagram for one pixel (P1) in the display apparatus 100 comprising an organic light emitting diode (OLED) functioning as the emission device 710. Accordingly, the display apparatus 100 according to one aspect of the present disclosure is an organic light emitting diode (OLED) display apparatus.

The pixel driver (PDC) of FIG. 2 includes a first thin film transistor (TR1) corresponding to a switching transistor, and a second thin film transistor (TR2) corresponding to a driving transistor. Also, the pixel driver (PDC) includes a plurality of signal lines (DL, GL, PL).

According to one aspect of the present disclosure, a gate line (GL) is referred to as a first signal line, a data line (DL) is referred to as a second signal line, and a driving power line (PL) is referred to as a third signal line, however, it is not limited to the above structure. The data line (DL) may be the first signal line or the third signal line. Also, the gate line (GL) may be the second signal line or the third signal line. In the same manner, the driving power line (PL) may be the first signal line or the second signal line.

Hereinafter, for convenience of explanation, one aspect of the present disclosure in which the gate line is the first signal line, the data line (DL) is the second signal line, and the driving power line (PL) is the third signal line will be described in detail.

Referring to FIGS. 2 and 3, the first thin film transistor (TR1) is connected with the gate line (GL) and the data line (DL), and the first thin film transistor (TR1) is turned-on or turned-off by the scan signal (SS) supplied through the gate line (GL).

The data line (DL) provides the data voltage (Vdata) to the pixel driver (PDC), and the first thin film transistor (TR1) controls applying the data voltage (Vdata).

The driving power line (PL) provides a driving voltage (Vdd) to the display device 710, and the second thin film transistor (TR2) controls the driving voltage (Vdd). Herein, the driving voltage (Vdd) is a pixel driving voltage for driving the organic light emitting diode (OLED) corresponding to the display device 710.

When the first thin film transistor (TR1) is turned-on, the data voltage (Vdata), which is supplied through the data line (DL), is supplied to a gate electrode (G2) of the second thin film transistor (TR2) connected with the emission device 710. The data voltage (Vdata) is charged in a first capacitor (C1) provided between a source electrode (S2) and the gate electrode (G2) of the second thin film transistor (TR2). The first capacitor (C1) is a storage capacitor (Cst).

An amount of current supplied to the organic light emitting diode (OLED) corresponding to the display device 710 through the second thin film transistor (TR2) is controlled in accordance with the data voltage (Vdd), whereby it is possible to control a grayscale of light emitted from the display device 710.

Referring to FIGS. 3 and 4, the display apparatus 100 according to one aspect of the present disclosure includes the first signal line (GL) and the second signal line (DL) crossing each other on the substrate 210, and also includes a first gate electrode (G1), a first source electrode (S1), a first drain electrode (D1), and a second gate electrode (G2) which are disposed on the same layer as that of the first signal line (GL). Also, the display apparatus 100 according to one aspect of the present disclosure includes a first active layer (A1) which is spaced apart from the first gate electrode (G1) and is partially overlapped with the first gate electrode (G1), a second active layer (A2) which is spaced apart from the second gate electrode (G2) and is partially overlapped with the second gate electrode (G2), and a first electrode 711 of the display device 710 connected with the second active layer (A2).

As described above, in case of the display apparatus 100 according to one aspect of the present disclosure, the first signal line is the gate line (GL), and the second signal line is the data line (DL). The gate line (GL) corresponding to the first signal intersects with the data line (DL) corresponding to the second signal line.

The substrate 210 may be formed of glass or plastic. The substrate 210 may be formed of plastic having flexibility, for example, polyimide (PI).

The gate line (GL) corresponding to the first signal line, the first gate electrode (G1), the first source electrode (S1), the first drain electrode (D1), and the second gate electrode (G2) are disposed on the substrate 210.

The first gate electrode (G1), the first source electrode (S1), the first drain electrode (D1), and the second gate electrode (G2) are disposed on the same layer as that of the gate line (GL).

Also, a first portion (DL1) and a second portion (DL2) included in the data line (DL) corresponding to the second signal line are disposed on the same layer as that of the gate line (GL).

Referring to FIGS. 3 and 4, the data line (DL) includes the first portion (DL1), the second portion (DL2), and a first connection electrode (BR1). The first portion (DL1) of the data line (DL) is spaced apart from the second portion (DL2) of the data line (DL) with the gate line (GL) therebetween.

The first connection electrode (BR1) connects the first portion (DL1) of the data line (DL) with the second portion (DL2) of the data line (DL). The first connection electrode (BR1) is spaced apart from the gate line (GL), and at least a portion of the first connection electrode (BR1) may be overlapped with the gate line (GL).

The gate line (GL), the first gate electrode (G1), the first source electrode (S1), the first drain electrode (D1), the second gate electrode (G2), and the first and second portions (DL1, DL2) of the data line (DL) may be manufactured together by the same process using the same material.

The gate line (GL), the first gate electrode (G1), the first source electrode (S1), the first drain electrode (D1), the second gate electrode (G2), and the first and second portions (DL1, DL2) of the data line (DL) may include at least one among aluminum-based metal such as aluminum or aluminum alloy, argentums-based metal such as argentums (Ag) or argentums alloy, copper-based metal such as copper (Cu) or copper alloy, molybdenum-based metal such as molybdenum or molybdenum alloy, chrome (Cr), tantalum (Ta), neodymium (Nd), and titanium (Ti). The gate line (GL), the first gate electrode (G1), the first source electrode (S1), the first drain electrode (D1), the second gate electrode (G2) and the first and second portions (DL1, DL2) of the data line (DL) may have a multi-layered structure including at least two layers with the different physical properties.

According to one aspect of the present disclosure, the first gate electrode (G1) is connected with any one of the first signal line and the second signal line. Referring to FIG. 3, the first gate electrode (G1) is connected with the gate line (GL) corresponding to the first signal line. The first gate electrode (G1) may be the region extended from the gate line (GL), or may be one region of the gate line (GL). Referring to FIG. 3, the first gate electrode (G1) may be the region extended from the gate line (GL).

According to one aspect of the present disclosure, any one of the first source electrode (S1) and the first drain electrode (D1) may be connected with the second gate electrode (G2), and the other of the first source electrode (S1) and the first drain electrode (D1) may be connected with any one of the first signal line and the second signal line.

In detail, referring to FIG. 3, the first drain electrode (D1) is connected with the second gate electrode (G2), and the first source electrode (S1) is connected with the data line (DL) corresponding to the second signal line. However, one aspect of the present disclosure is not limited to the above structure. The first source electrode (S1) may be connected with the second gate electrode (G2), and the first drain electrode (D1) may be connected with the data line (DL).

According to one aspect of the present disclosure, the first source electrode (S1) may be one region of the data line (DL), and may be the region extended from the data line (DL). Referring to FIGS. 3 and 4, the first source electrode (S1) may be the region extended from the data line (DL).

Referring to FIG. 3, the first drain electrode (D1) and the second gate electrode (G2) may be formed as one body.

According to one aspect of the present disclosure, the first gate electrode (G1) and the second gate electrode (G2) respectively protect a channel region 31 of the first active layer (A1) and a channel region 31 of the second active layer (A2). Also, according to one aspect of the present disclosure, the gate line (GL), the first gate electrode (G1), the first source electrode (S1), the first drain electrode (D1), the second gate electrode (G2), the first portion (DL1) of the data line (DL), and the second portion (DL2) of the data line (DL) may be manufactured by the same process.

Thus, according to one aspect of the present disclosure, it is possible not to provide an additional light shielding layer for protecting the channel region, and to omit an additional process for forming the source and drain electrodes. As a result, a structure of the display apparatus 100 is simplified, and a manufacturing process of the display apparatus 100 is also simplified.

Referring to FIGS. 3 and 4, a first capacitor electrode (C11) of the first capacitor (C) is disposed on the same layer as that of the second gate electrode (G2). The first capacitor electrode (C11) may be disposed on the same layer as those of the first gate electrode (G1) and the second gate electrode (G2). The first capacitor electrode (C11) and the second gate electrode (G2) may be formed as one body, and may be manufactured together with the second gate electrode (G2) by the same process using the same material.

Also, the first capacitor electrode (C11) and the first drain electrode (D1) may be formed as one body, and may be manufactured together with the first drain electrode (D1) by the same process using the same material.

The display apparatus 100 according to one aspect of the present disclosure further includes a third signal line (PL). The third signal line (PL) may intersect with any one of the first signal line (GL) and the second signal line (DL). Referring to FIGS. 3 and 4, the driving power line (PL) corresponding to the third signal line intersects with the gate line (GL) corresponding to the first signal line.

The driving power line (PL) includes a first portion (PL1), a second portion (PL2), and a second connection electrode (BR2). The first portion (PL1) of the driving power line (PL) and the second portion (PL2) of the driving power line (PL) are disposed on the same layer as that of the gate line (GL). The first portion (PL1) of the driving power line (PL) is spaced apart from the second portion (PL2) of the driving power line (PL) with the gate line (GL) therebetween. The second connection electrode (BR2) connects the first portion (PL1) of the driving power line (PL) with the second portion (PL2) of the driving power line (PL). The second connection electrode (BR2) is spaced apart from the gate line (GL), and at least a portion of the second connection electrode (BR2) is overlapped with the gate line (GL).

Referring to FIG. 3, the second drain electrode (D2) is disposed on the substrate 210. The second drain electrode (D2) may be one region of the driving power line (PL), or may be the region extended from the driving power line (PL). Referring to FIGS. 3 and 4, the second drain electrode (D2) may be the region extended from the driving power line (PL).

A gate insulating film 230 is disposed on the gate line (GL), the first gate electrode (G1), the first source electrode (S1), the first drain electrode (D1), the second gate electrode (G2), the first portion (DL1) of the data line (DL), the second portion (DL2) of the data line (DL), the first capacitor electrode (C11) of the first capacitor (C1), the first portion (PL1) of the driving power line (PL), the second portion (PL2) of the driving power line (PL), and the second drain electrode (D2).

The gate insulating film 230 has the insulating properties. For example, the gate insulating film 230 may be formed of an insulating material, for example, silicon oxide or silicon nitride.

The first active layer (A1) and the second active layer (A2) are disposed on the gate insulating film 230. The first active layer (A1) is spaced apart from the first gate electrode (G1), and at least a portion of the first active layer (A1) is overlapped with the first gate electrode (G1). The second active layer (A2) is spaced apart from the second gate electrode (G2), and at least a portion of the second active layer (A2) is overlapped with the second gate electrode (G2).

According to one aspect of the present disclosure, the first active layer (A1) and the second active layer (A2) are disposed on the first gate electrode (G1) and the second gate electrode (G2), respectively. The first active layer (A1) and the second active layer (A2) may be manufactured together by the same mask process.

According to one aspect of the present disclosure, the first active layer (A1) and the second active layer (A2) may include an oxide semiconductor material. For example, the first active layer (A1) and the second active layer (A2) may include at least one among IZO(InZnO)-based oxide semiconductor, IGO(InGaO)-based oxide semiconductor, GO(GaO)-based oxide semiconductor, ITO(InSnO)-based oxide semiconductor, IGZO(InGaZnO)-based oxide semiconductor, IGTO(InGaSnO)-based oxide semiconductor, IGZTO(InGaZnSnO)-based oxide semiconductor, GZTO(GaZnSnO)-based oxide semiconductor, GZO(GaZnO)-based oxide semiconductor, and ITZO(InSnZnO)-based oxide semiconductor. However, one aspect of the present disclosure is not limited to the above materials. The first and second active layers (A1, A2) may be formed of other oxide semiconductor materials generally known to those in the art.

The first active layer (A1) functions as an active layer of the first thin film transistor (TR1), and the second active layer (A2) functions as an active layer of the second thin film transistor (TR2).

By a selective conductivity providing process, some regions of the first and second active layers (A1, A2) become conducting regions.

Some regions of the first and second active layers (A1, A2), which are overlapped with the first and second gate electrodes (G1, G2), are not provided with conductivity, and thus do not become the conducting regions, but become the channel region 31. Some regions of the first and second active layer (A1, A2), which are not overlapped with the first and second gate electrodes (G1, G2), are provided with conductivity, and thus become the conducting regions 32 and 33. Generally, the conducting regions 32 and 33 may be formed at both sides with respect to the channel region 31.

According to one aspect of the present disclosure, some regions of the first and second active layers (A1, A2) may be the conducting regions by a doping process using dopant. In this case, doped regions become the conducting regions. For the doping process, at least one of boron (B) ion, phosphorous (P) ion, and fluorine (F) ion may be used.

However, one aspect of the present disclosure is not limited to the above. Herein, some regions of the first and second active layers (A1, A2) may be provided with conductivity by a dry etching process, or a photo irradiation process. For example, ultraviolet ray is irradiated onto the substrate 210, whereby some regions of the first and second active layers (A1, A2), which are not overlapped with the first and second gate electrodes (G1, G2), may be provided with conductivity, and thus may be the conducting regions. If ultraviolet ray is irradiated onto the substrate 210, the first and second gate electrodes (G1, G2) function as a mask for blocking ultraviolet ray, whereby the other regions of the first and second active layers (A1, A2), which are overlapped with the first and second gate electrodes (G1, G2), are not provided with conductivity, and thus remains as the regions having the semiconductor properties. As a result, the regions of the first and second active layers (A1, A2), which are overlapped with the first and second gate electrodes (G1, G2), may be the channel region 31.

Any one of the conducting regions 32 and 33 of the first and second active layers (A1, A2) becomes a source region 32, and the other becomes a drain region 33. The source region 32 serves as a source connection region connected with the source electrode (S1, S2), or the source region 32 itself serves as the source electrode (S1, S2). The drain region 33 serves as a drain connection region connected with the drain electrode (D1, D2), or the drain region 33 itself serves as the drain electrode (D1, D2).

The source region 32 and the drain region 33 shown in the drawings are distinguished from each other, for convenience of explanation. However, the source region 32 and the drain region 33 may be used interchangeably. The source region 32 may become the drain region 33, and the drain region 33 may become the source region 32. Also, the source region 32 may become the source electrode (S1, S2) and the drain electrode (D1, D2), and the drain region 33 may become the drain electrode (D1, D2) and the source electrode (S1, S2).

The first active layer (A1) contacts the first source electrode (S1) and the first drain electrode (De) via a contact hole (H1, H2) formed in the gate insulating film 230.

In detail, the source region 32 of the first active layer (A1) contacts the first source electrode (S1) via a first contact hole (H1) formed in the gate insulating film 230. The drain region 33 of the first active layer (A1) contacts the first drain electrode (D1) via a second contact hole (H2) formed in the gate insulating film 230.

The drain region 33 of the second active layer (A2) is connected with the second drain electrode (D2) via a third contact hole (H3) formed in the gate insulating film 230.

According to one aspect of the present disclosure, the source region 32 of the second active layer (A2) serves as the second source electrode (S2).

A protection layer 250 is disposed on the first and second active layers (A1, A2). The protection layer 250 is provided to planarize an upper surface of the first and second active layers (A1, A2), and to protect the pixel driver (PDC), whereby the protection layer 250 may be referred to as a planarization layer.

Referring to FIG. 4, the display device 710 is disposed on the protection layer 250. In detail, the first electrode 711 of the display device 710 is disposed on the protection layer 250, and an emission layer 712 and a second electrode 713 are sequentially disposed on the first electrode 711, to thereby form the display device 710. In FIG. 4, the first pixel 711 is a pixel electrode, and the second electrode 713 is a common electrode.

The first electrode 711 of the display device 710 is connected with the second active layer (A2). In detail, the first electrode 711 of the display device 710 is connected with the second source electrode (S2) via a fourth contact hole (H4), whereby the first electrode 711 of the display device 710 may be electrically connected with the second active layer (A2). The fourth contact hole (H4) is formed in the protection layer 250.

Also, the first connection electrode (BR1) and the second connection electrode (BR2) are disposed on the protection layer 250.

The first connection electrode (BR1) is disposed on the same layer as that of the first electrode 711, and the first connection electrode (BR1) is connected with the first and second portions (DL1, DL2) of the data line (DL) corresponding to the second signal line via fifth and sixth contact holes (H5, H6).

The second connection electrode (BR2) is disposed on the same layer as that of the first electrode 711, and the second connection electrode (BR2) is connected with the first and second portions (PL1, PL2) of the driving power line (PL) corresponding to the third signal line via seventh and eighth contact holes (H7, H8).

The first connection electrode (BR1) and the second connection electrode (BR2) are formed of the same material as that of the first electrode 711. The first connection electrode (BR1) and the second connection electrode (BR2) are manufactured together with the first electrode 711 by the same mask process.

According to one aspect of the present disclosure, one portion of the first electrode 711 of the display device 710, which is overlapped with the first capacitor electrode (C11), may function as a second capacitor electrode (C12). Thus, the first capacitor electrode (C11) overlaps with the first electrode 711 of the display device 710 so that it is possible to form the first capacitor (C1).

A bank layer 750 is disposed on the periphery of the first electrode 711. The bank layer 750 defines an emission area of the display device 710.

The emission layer 712 is disposed on the first electrode 711. Herein, the emission layer 712 is an organic emission layer including an organic material. The second electrode 713 is disposed on the emission layer 712. Accordingly, it is possible to complete the display device 710.

The display device 710 shown in FIG. 4 corresponds to an organic light emitting diode (OLED). Thus, the display apparatus 100 according to one aspect of the present disclosure corresponds to an organic light emitting diode (OLED) display apparatus.

According to one aspect of the present disclosure, the first thin film transistor (TR1) includes the first active layer (A1), the first gate electrode (A1), the first source electrode (S1), and the first drain electrode (D1). Also, the second thin film transistor (TR2) includes the second active layer (A2), the second gate electrode (A2), the second source electrode (S2), and the second drain electrode (D2).

According to one aspect of the present disclosure, as shown in FIG. 4, the first gate electrode (G1) is disposed between the substrate 210 and the first active layer (A1), and the second gate electrode (G2) is disposed between the substrate 210 and the second active layer (A2). According to one aspect of the present disclosure, the first thin film transistor (TR1) and the second thin film transistor (TR2)

may have a bottom gate structure where the gate electrode (G1, G2) is disposed below the active layer (A1, A2).

Meanwhile, in contrast to the bottom gate structure, a structure of the thin film transistor where the gate electrode (G1, G2) is disposed above the active layer (A1, A2) is referred to as a top gate structure.

In case of the thin film transistor of the bottom gate structure, the number of deposited layers is relatively smaller in comparison to that of the top gate structure so that it is possible to simplify a manufacturing process, and to decrease an occupying size of the thin film transistor. Thus, the aspect of the present disclosure may be usefully applied to a high resolution display apparatus with high density of the thin film transistor.

Figure 5:
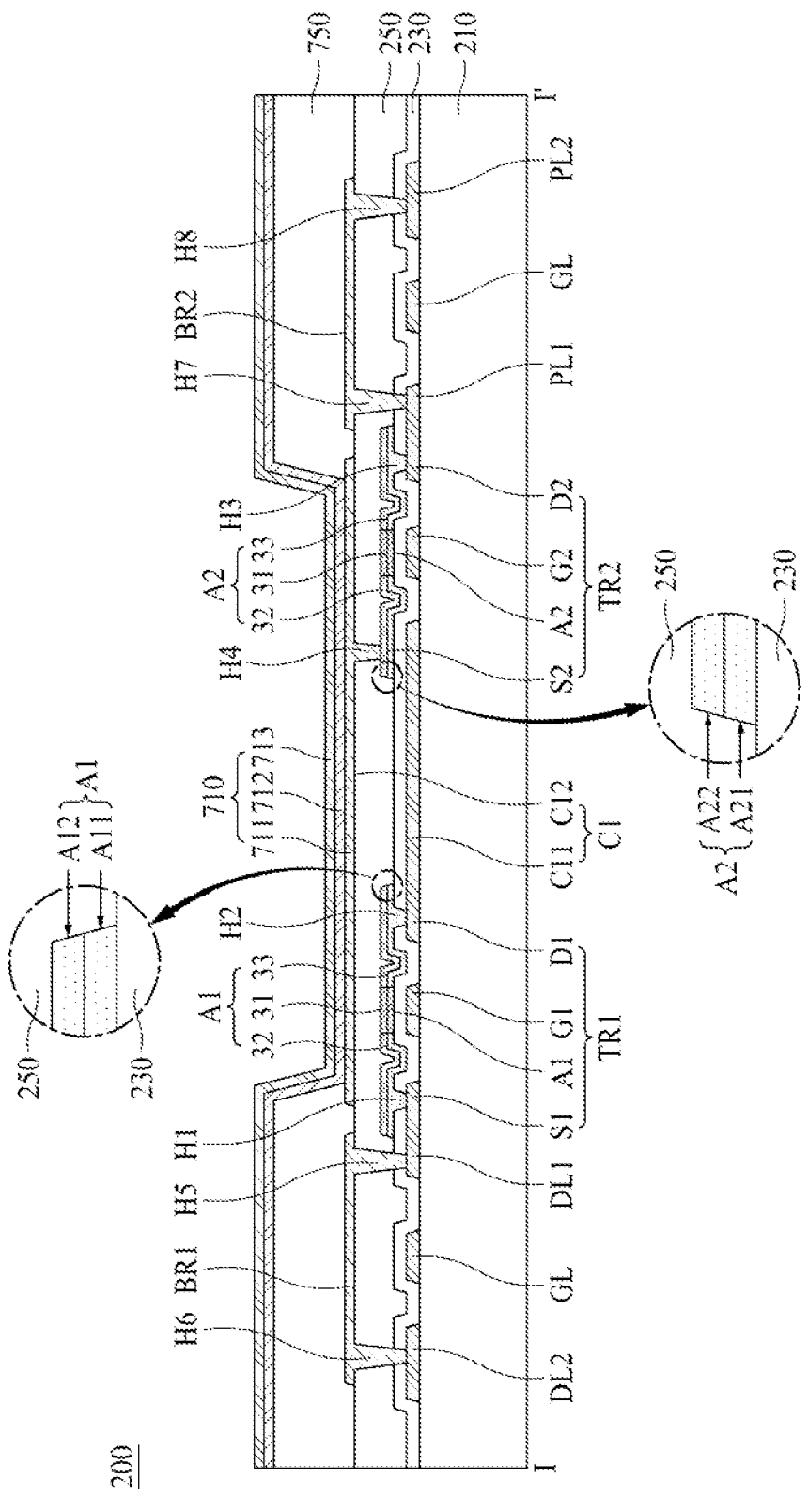
FIG. 5 is a cross sectional view illustrating a pixel of a display apparatus according to another aspect of the present disclosure.

FIG. 5 is a cross sectional view illustrating a pixel of a display apparatus 200 according to another aspect of the present disclosure.

In the display apparatus 200 shown in FIG. 5, an active layer (A1, A2) has a multi-layered structure. Referring to FIG. 5, a first active layer (A1) includes a first oxide semiconductor layer (A11) on a first gate electrode (G1), and a second oxide semiconductor layer (A12) on the first oxide semiconductor layer (A11). The second active layer (A2) includes a first oxide semiconductor layer (A21) on a second gate electrode (G2), and a second oxide semiconductor layer (A22) on the first oxide semiconductor layer (A21).

According to one aspect of the present disclosure, the second oxide semiconductor layer (A12, A22) serves as a protection layer configured to protect the first oxide semiconductor layer (A11, A21), and the first oxide semiconductor layer (A11, A21) serves as a channel layer. Typically, a channel of the active layer (A1, A2) is provided in the first oxide semiconductor layer (A11, A21). However, one aspect of the present disclosure is not limited to the above. A channel of the active layer (A1, A2) may be provided in the second oxide semiconductor layer (A12, A22).

For improvement of the film stability, the second oxide semiconductor layer (A12, A22), which serves as the protection layer, may include gallium (Ga). According to one aspect of the present disclosure, the second oxide semiconductor layer (A12, A22) may include at least one among IGZO(InGaZnO)-based oxide semiconductor material, IGO (InGaO)-based oxide semiconductor material, IGTO(InGaSnO)-based oxide semiconductor material, GZO (GaZnO)-based oxide semiconductor material, IGZTO (InGaZnSnO)-based oxide semiconductor material, GZTO (GaZnSnO)-based oxide semiconductor material, and GO(GaO)-based oxide semiconductor material. However, one aspect of the present disclosure is not limited to the above materials. The second oxide semiconductor layer (A12, A22) may be formed of other oxide semiconductor materials generally known to those in the art.

The first oxide semiconductor layer (A11, A21) may include at least one among IZO(InZnO)-based oxide semiconductor, IGO(InGaO)-based oxide semiconductor, ITO (InSnO)-based oxide semiconductor, IGZO(InGaZnO)-based oxide semiconductor, IGZTO(InGaZnSnO)-based oxide semiconductor, GZTO(GaZnSnO)-based oxide semiconductor, GZO(GaZnO)-based oxide semiconductor, and ITZO(InSnZnO)-based oxide semiconductor. However, one aspect of the present disclosure is not limited to the above materials. The first oxide semiconductor layer (A11, A21) may be formed of other oxide semiconductor materials generally known to those in the art.

The first oxide semiconductor layer (A11, A21) has the electrical properties which are greater than that of the second oxide semiconductor layer (A12, A22), and the second oxide semiconductor layer (A12, A22) has the greater film stability than that of the first oxide semiconductor layer (A11, A21). Also, according to one aspect of the present disclosure, the first oxide semiconductor layer (A11, A21) has the greater tolerance to etching than that of the second oxide semiconductor layer (A12, A22), whereby the first active layer (A1) and the second active layer (A2) may have a tapered shape.

Figure 6:
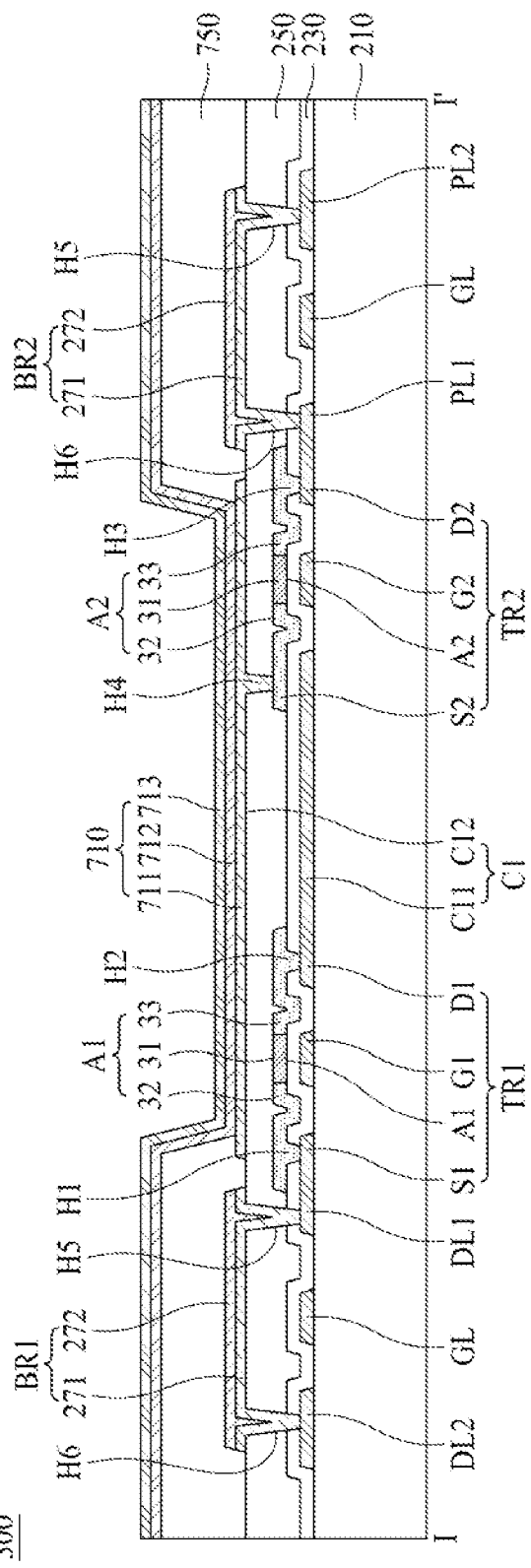
FIG. 6 is a cross sectional view illustrating a pixel of a display apparatus according to another aspect of the present disclosure.

FIG. 6 is a cross sectional view illustrating a pixel of a display apparatus 300 according to another aspect of the present disclosure.

Referring to FIG. 6, a first connection electrode (BR1) includes a transparent conductive oxide (TCO) layer 271 which is formed of the same material as that of a first electrode 711 of a display device 710, and a metal layer 272 on the TCO layer 271.

Also, a second connection electrode (BR2) includes a transparent conductive oxide (TCO) layer 271 which is formed of the same material as that of the first electrode 711 of the display device 710, and a metal layer 272 on the TCO layer 271.

The TCO layer 271 may include at least one among ITO(InSnO), ZnO, $In_2O_3$, MgO and $SnO_2$. However, one aspect of the present disclosure is not limited to the above. The TCO layer 271 may be formed of other transparent conductive oxide materials generally known to those in the art.

The first electrode 711 of the display device 710, the first connection electrode (BR1), and the second connection electrode (BR2), which are shown in FIG. 6, may be manufactured at the same time by a patterning process using a halftone mask.

For example, a first layer of a transparent conductive oxide material and a second layer of a metal material are sequentially provided on a protection layer 250, and then the patterning process using the halftone mask is carried out so that only the layer of the transparent conductive oxide material remains in the area of the first electrode 711 of the display device 710, and both the layer of the transparent conductive oxide material and the layer of the metal material remain in the area of the first connection electrode (BR1) and the second connection electrode (BR2). According to the above method, it is possible to manufacture the first electrode 711 of the display device 710, the first connection electrode (BR1), and the second connection electrode (BR2) at the same time.

Figure 7:
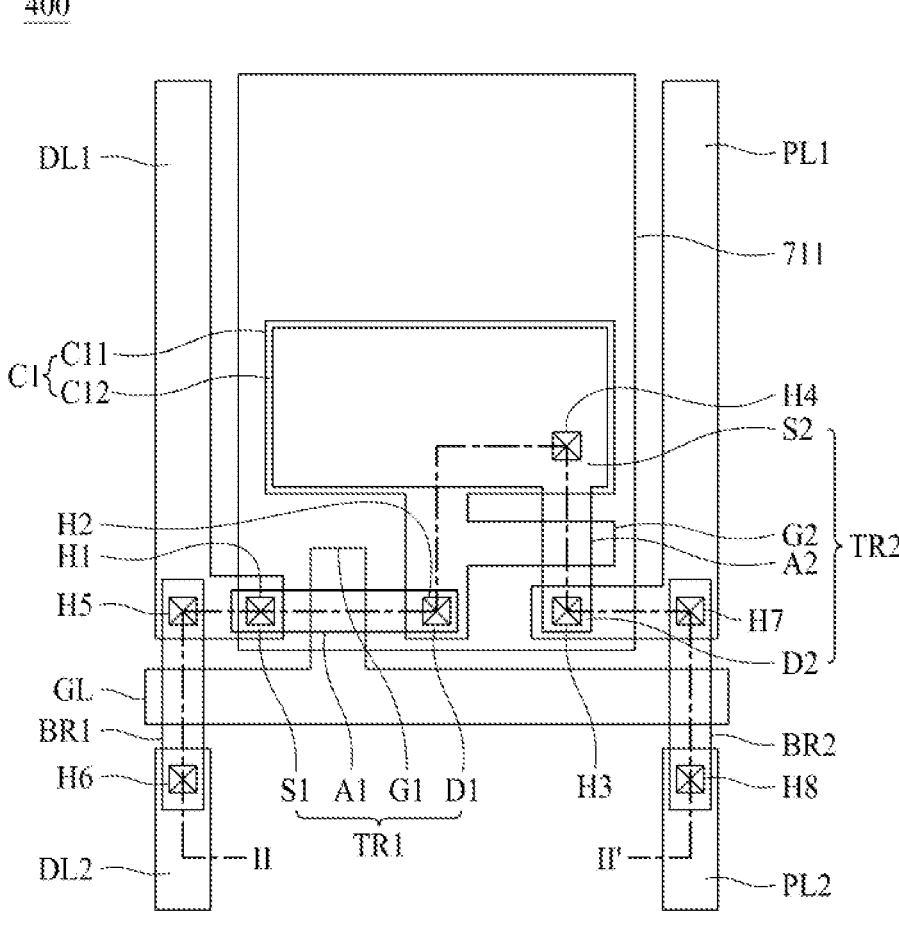
FIG. 7 is a plan view illustrating a pixel of a display apparatus according to another aspect of the present disclosure.
Figure 8:
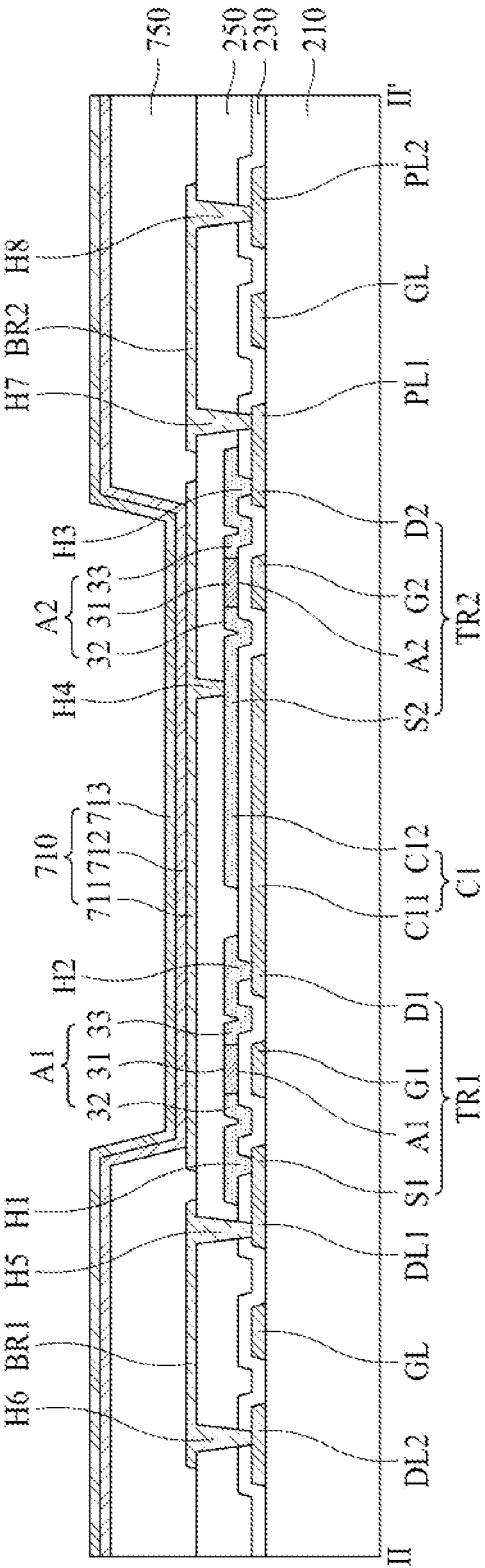
FIG. 8 is a cross sectional view along II-II' of FIG. 7.

FIG. 7 is a plan view illustrating a pixel of a display apparatus 400 according to another aspect of the present disclosure. FIG. 8 is a cross sectional view along II-II' of FIG. 7.

Referring to FIGS. 7 and 8, a second capacitor electrode (C12) connected with a second source electrode (S2) is disposed on a gate insulating film 230. The second capacitor electrode (C12) may be formed as one body with a second active layer (A2). Also, the second capacitor electrode (C12) may be connected with a first electrode 711 of a display device 710.

According to another aspect of the present disclosure, some portions of a conducting region 32 and 33 of the second active layer (A2) may be the second capacitor electrode (C12). As shown in FIGS. 7 and 8, a source connection region 32 included in the conducting region 32 and 33 of the second active layer (A2) extends so that the source connection region 32 is overlapped with a first capacitor electrode (C11) of a first capacitor (C1), whereby it may serve as the second capacitor electrode (C12). The second capacitor electrode (C12) is overlapped with the first capacitor electrode (C11), to thereby form the first capacitor (C1).

Figure 9:
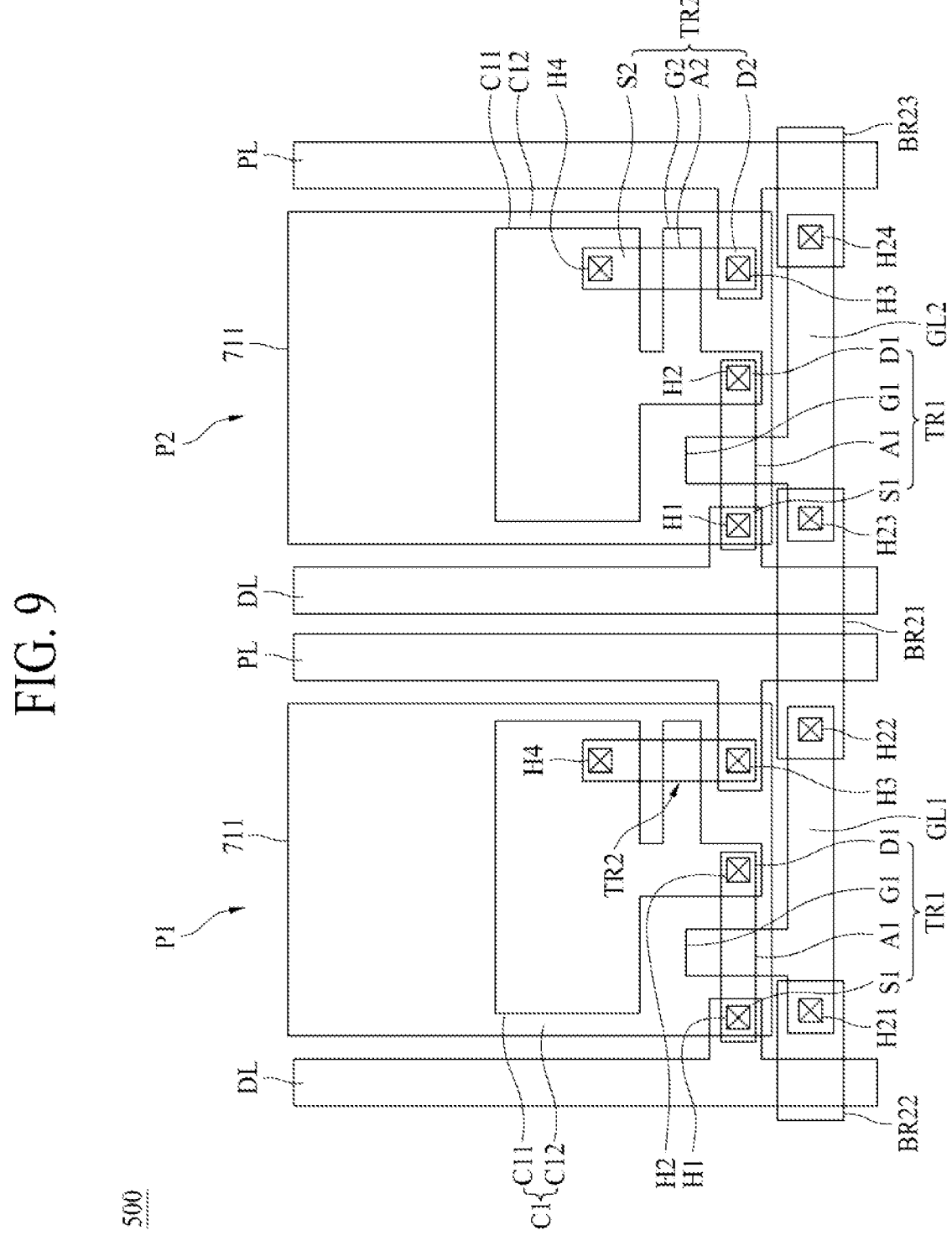
FIG. 9 is a plan view illustrating pixels of a display apparatus according to another aspect of the present disclosure.

FIG. 9 is a plan view illustrating pixels (P1, P2) of a display apparatus 500 according to another aspect of the present disclosure.

In FIG. 9, a data line (DL) is a first signal line, and a gate line (GL) is a second signal line.

Referring to FIG. 9, the data line (DL) corresponding to the first signal line and the gate line (GL) corresponding to the second signal line are disposed on a substrate 210. The data line (DL) corresponding to the first signal line and the gate line (GL) corresponding to the second signal line intersect with each other.

The gate line (GL) includes a first portion (GL1), a second portion (GL2), and a first connection electrode (BR21). The first portion (GL1) of the gate line (GL) is spaced apart from the second portion (GL2) of the gate line (GL) with the data line (DL) therebetween. Referring to FIG. 9, the first portion (GL1) of the gate line (GL) is disposed in a first pixel (P1), and the second portion (GL2) of the gate line (GL) is disposed in a second pixel (P2).

The first connection electrode (BR21) connects the first portion (GL1) of the gate line (GL) with the second portion (GL2) of the gate line (GL). The first connection electrode (BR21) is spaced apart from the data line (GL), and at least a portion of the first connection electrode (BR21) may be overlapped with the data line (DL).

A second connection electrode (BR22) of FIG. 9 may connect the first portion (GL1) of the gate line (GL) disposed in the first pixel (P1) with one portion of the gate line (GL) disposed in the left-sided pixel of the drawing. Also, a third connection electrode (BR23) of FIG. 9 may connect the second portion (GL2) of the gate line (GL) disposed in the second pixel (P2) with one portion of the gate line (GL) disposed in the right-sided pixel of the drawing.

Referring to FIG. 9, the display apparatus 500 according to another aspect of the present disclosure may further include a driving power line (PL). In another aspect of the present disclosure, the driving power line (PL) may be referred to as a third signal line.

The driving power line (PL) corresponding to the third signal line intersects with the gate line (GL) corresponding to the second signal line. The first connection electrode (BR21) is spaced apart from the driving power line (PL), and at least a portion of the first connection electrode (BR21) may be overlapped with the driving power line (PL).

Figure 10:
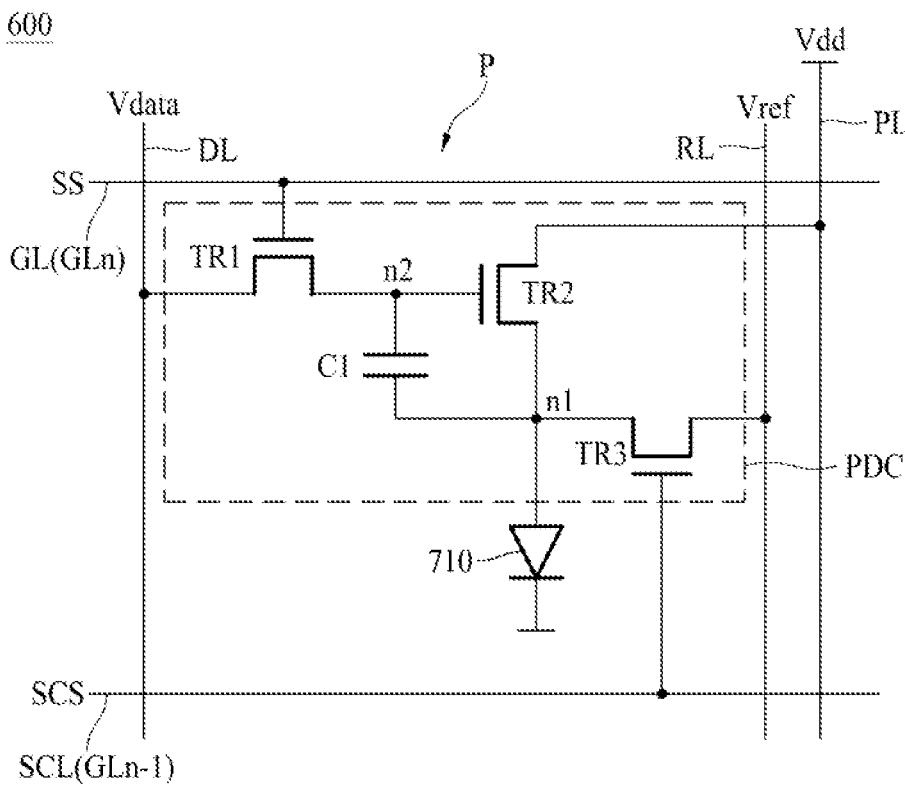
FIG. 10 is a circuit diagram for any one pixel of a display apparatus according to another aspect of the present disclosure.

FIG. 10 is a circuit diagram for any one pixel of a display apparatus 600 according to another aspect of the present disclosure. FIG. 10 is an equivalent circuit diagram for a pixel (P) of an organic light emitting display apparatus.

The pixel (P) of the display apparatus 600 shown in FIG. 10 includes an organic light emitting diode (OLED) corresponding to a display device 710, and a pixel driver (PDC) configured to drive the display device 710. The display device 710 is connected with the pixel driver (PDC).

In the pixel (P), there are signal lines (DL, GL, PL, RL, SCL) configured to supply signals to the pixel driver (PDC).

A data voltage (Vdata) is supplied to a data line (DL), a scan signal (SS) is supplied to a gate line (GL), a driving voltage (Vdd) for driving the pixel is supplied to a driving power line (PL), a reference voltage (Vref) is supplied to a reference line (RL), and a sensing control signal (SCS) is supplied to a sensing control line (SCL).

Referring to FIG. 10, when the gate line of the (n)th pixel (P) is referred to as "$GL_n$", the gate line of the neighboring (n−1)th pixel (P) is "$GL_{n-1}$", and "$GL_{n-1}$" corresponding to the gate line of the (n−1)th pixel (P) serves as the sensing control line (SCL) of the (n)th pixel (P).

For example, as shown in FIG. 10, the pixel driver (PDC) includes a first thin film transistor (TR1, switching transistor) connected with the gate line (GL) and the data line (DL), a second thin film transistor (TR2, driving transistor) configured to control a level of current which is provided to the display device 710 in accordance with the data voltage (Vdata) transmitted through the first thin film transistor (TR1), and a third thin film transistor (TR3, reference transistor) configured to sense the properties of the second thin film transistor (TR2).

A first capacitor (C1) is positioned between the display device 710 and a gate electrode (G2) of the second thin film transistor (TR2). The first capacitor (C1) is referred to as a storage capacitor (Cst).

According as the first thin film transistor (TR1) is turned-on by the scan signal (SS) supplied to the gate line (GL), the first thin film transistor (TR1) transmits the data voltage (Vdata), which is supplied to the data line (DL), to the gate electrode (G2) of the second thin film transistor (TR2).

The third thin film transistor (TR3) is connected with the reference line (RL) and a first node (n1) between the display device 710 and the second thin film transistor (TR2). The third thin film transistor (TR3) is turned-on or turned-off by the sensing control signal (SCS), and the third thin film transistor (TR3) senses the properties of the second thin film transistor (TR2) corresponding the driving transistor for a sensing period.

A second node (n2) connected with the gate electrode (G2) of the second thin film transistor (TR2) is connected with the first thin film transistor (TR1). The first capacitor (C1) is formed between the second node (n2) and the first node (n1).

When the first thin film transistor (TR1) is turned-on, the data voltage (Vdata) supplied through the data line (DL) is supplied to the gate electrode (G2) of the second thin film transistor (TR2). The first capacitor (C1) formed between a source electrode (S2) and the gate electrode (G2) of the second thin film transistor (TR2) is charged with the data voltage (Vdata).

When the second thin film transistor (TR2) is turned-on, the current is supplied to the display device 710 through the second thin film transistor (TR2) by the driving voltage (Vdd) for driving the pixel, whereby light is emitted from the display device 710.

Figure 11:
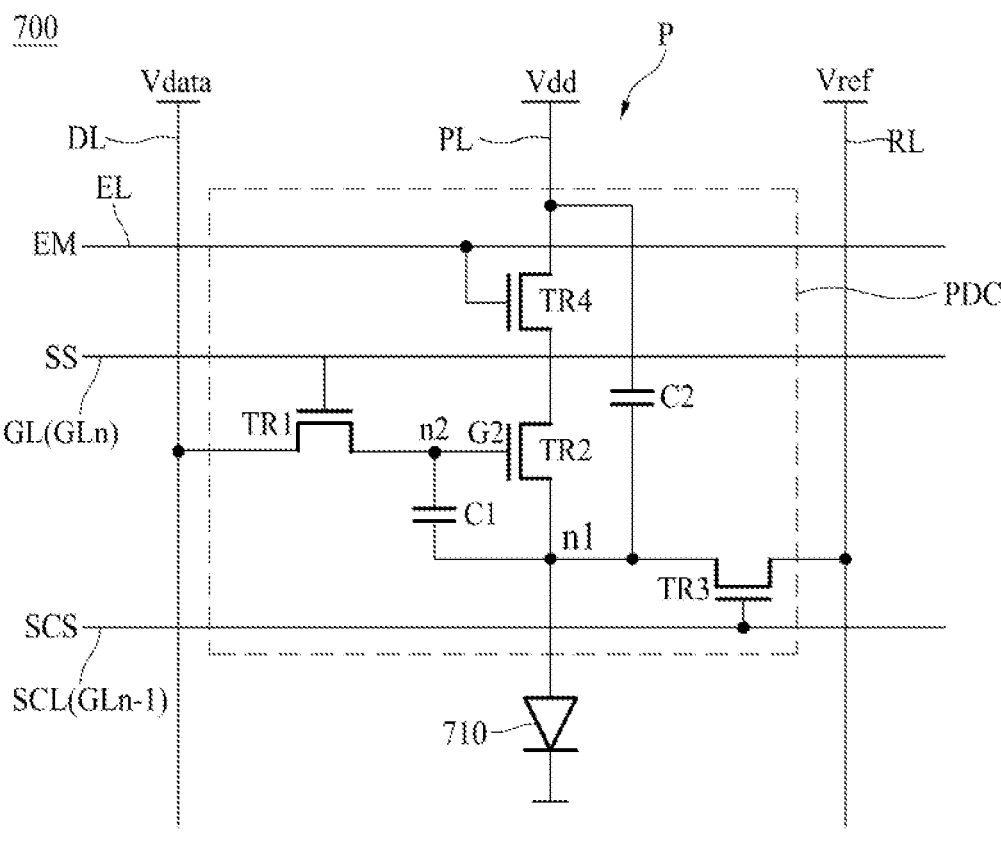
FIG. 11 is a circuit diagram for any one pixel of a display apparatus according to another aspect of the present disclosure.

FIG. 11 is a circuit diagram illustrating a pixel (P) applied to a display apparatus 700 according to another aspect of the present disclosure.

The pixel (P) of the display apparatus 700 shown in FIG. 11 includes an organic light emitting diode (OLED) corresponding to a display device 710, and a pixel driver (PDC) configured to drive the display device 710. The display device 710 is connected with the pixel driver (PDC).

The pixel driver (PDC) includes thin film transistors (TR1, TR2, TR3, TR4).

In the pixel (P), there are signal lines (DL, EL, GL, PL, SCL, RL) configured to supply driving signals to the pixel driver (PDC).

In comparison to the pixel (P) of FIG. 10, the pixel (P) of FIG. 11 further includes an emission control line (EL). An emission control signal (EM) is supplied to the emission control line (EL).

Also, in comparison to the pixel driver (PDC) of FIG. 10, the pixel driver (PDC) of FIG. 11 further includes a fourth thin film transistor (TR4) corresponding to an emission control transistor configured to control a light emission time point of the second thin film transistor (TR2).

Referring to FIG. 11, when the gate line of the (n)th pixel (P) is referred to as "$GL_n$", the gate line of the neighboring (n−1)th pixel (P) is "$GL_{n-1}$", and "$GL_{n-1}$" corresponding to the gate line of the (n−1)th pixel (P) serves as the sensing control line (SCL) of the (n)th pixel (P).

A first capacitor (C1) is positioned between the display device 710 and a gate electrode (G2) of the second thin film transistor (TR2). Also, a second capacitor (C2) is positioned between one electrode of the display device 710 and a terminal supplied with a driving voltage (Vdd) among terminals of the fourth thin film transistor (TR4).

According as the first thin film transistor (TR1) is turned-on by the scan signal (SS) supplied to the gate line (GL), the first thin film transistor (TR1) transmits the data voltage (Vdata), which is supplied to the data line (DL), to the gate electrode (G2) of the second thin film transistor (TR2).

The third thin film transistor (TR3) is connected with a reference line (RL). The third thin film transistor (TR3) is turned-on or turned-off by the sensing control signal (SC S), and the third thin film transistor (TR3) senses the properties of the second thin film transistor (TR2) corresponding the driving transistor for a sensing period.

The fourth thin film transistor (TR4) transmits the driving voltage (Vdd) to the second thin film transistor (TR2), or blocks the driving voltage (Vdd) in accordance with the emission control signal (EM). When the fourth thin film transistor (TR4) is turned-on, the current is supplied to the second thin film transistor (TR2), whereby light is emitted from the display device 710.

The pixel driver (PDC) according to another aspect of the present disclosure may be formed in various structures in addition to the above-described structure. For example, the pixel driver (PDC) may include five thin film transistors or more.

Hereinafter, a method for manufacturing the display apparatus 100 according to one aspect of the present disclosure will be described in detail as follows.

Figure 12A:
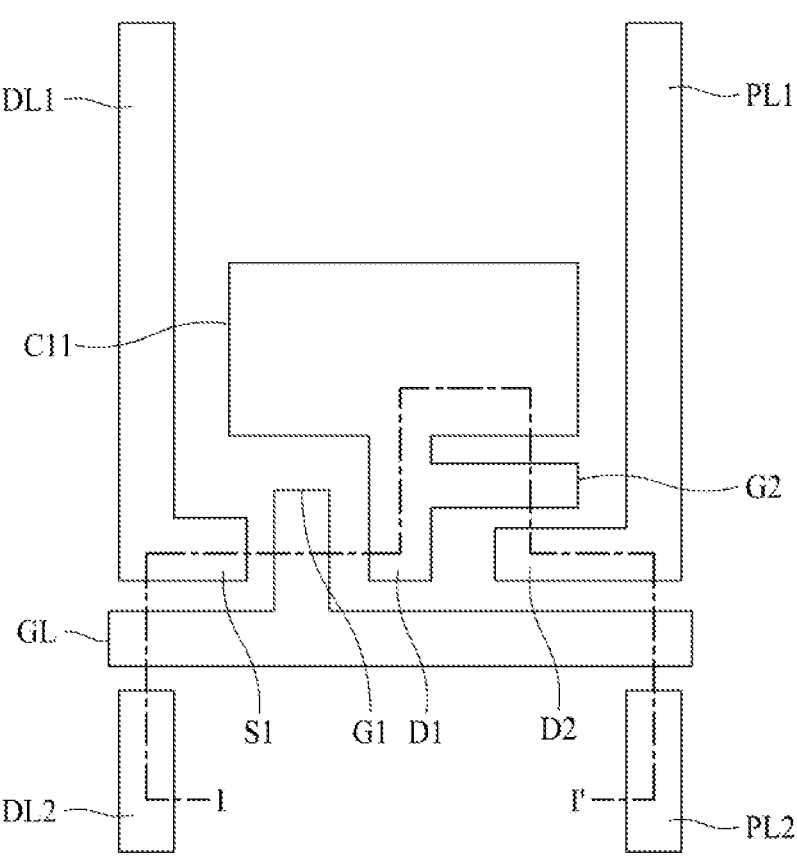
FIGS. 12A and 12B are respectively a plan view and a cross sectional view for a manufacturing process of the display apparatus according to one aspect of the present disclosure.
Figure 12B:
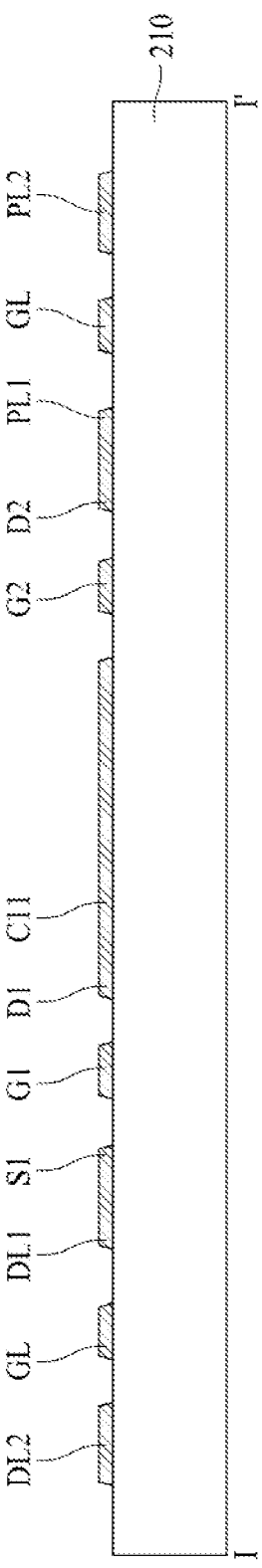

FIGS. 12A and 12B are respective plane and cross sectional views for a manufacturing process of the display apparatus 100 according to one aspect of the present disclosure.

Referring to FIGS. 12A and 12B, the gate line (GL) corresponding to the first signal line, the first gate electrode (G1), the first source electrode (S1), the first drain electrode (D1), the second gate electrode (G2), and the first portion (DL1) and second portion (DL2) of the data line (DL) corresponding to the second signal line are provided on the substrate 210. Also, the first portion (PL1) and second portion (PL2) of the driving power line (PL) corresponding to the third signal line is provided on the substrate 210, and the second drain electrode (D2) extending from the driving power line (PL) is also provided on the substrate 210. In this case, a mask process is carried out.

Figure 13A:
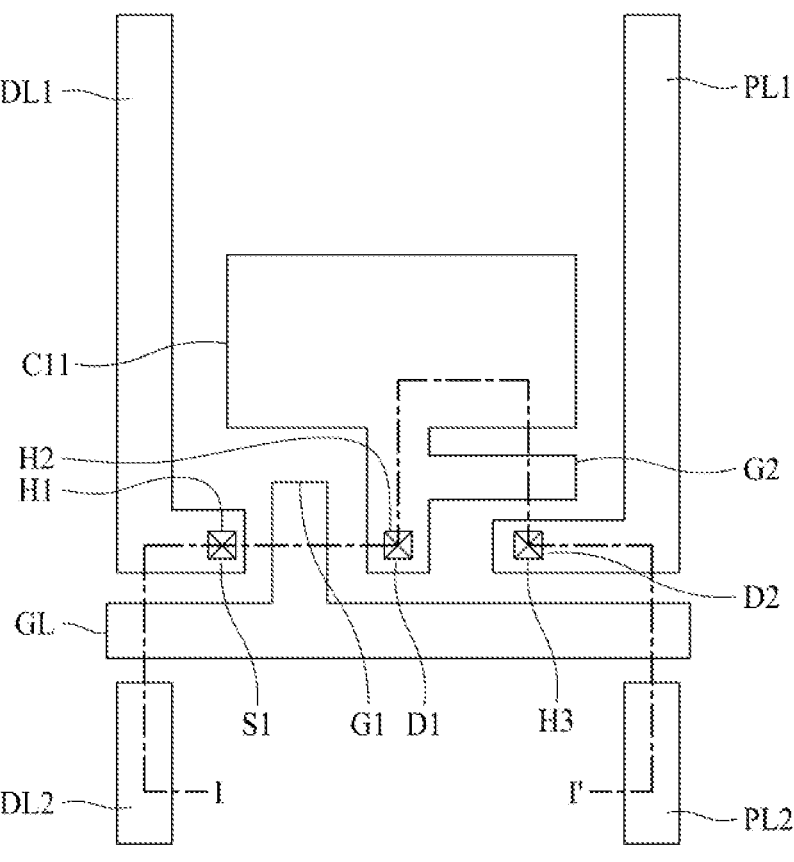
FIGS. 13A and 13B are respectively a plan view and a cross sectional view for a manufacturing process of the display apparatus according to one aspect of the present disclosure.
Figure 13B:
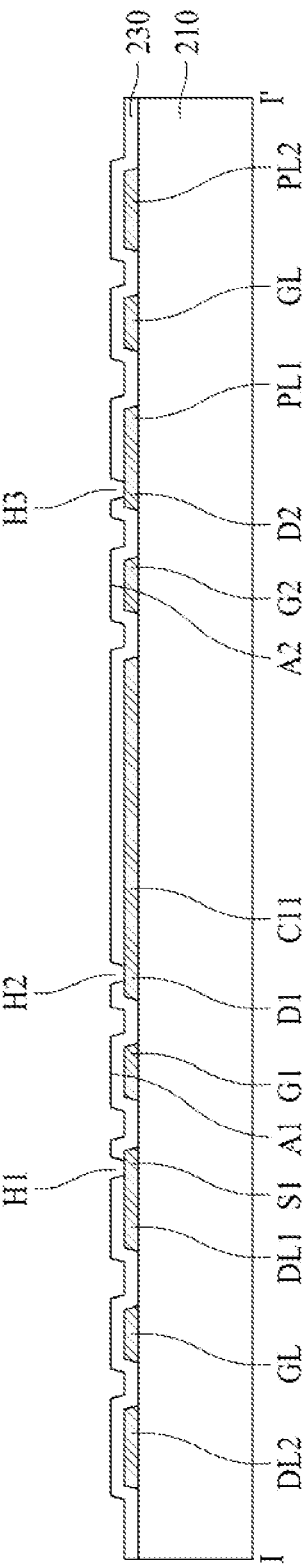

Then, referring to FIGS. 13A and 13B, the gate insulating film 230 is provided on the gate line (GL), the first gate electrode (G1), the first source electrode (S1), the first drain electrode (D1), the second gate electrode (G2), the first portion (DL1) and second portion (DL2) of the data line (DL), the first portion (PL1) and second portion (PL2) of the driving power line (PL), and the second drain electrode (D2).

The first contact hole (H1), the second contact hole (H2), and the third contact hole (H3) are provided on the gate insulating film 230. In this case, a mask process is carried out.

Then, referring to FIGS. 14A, 14B, 14C, 14D and 14E, the first active layer (A1) and the second active layer (A2) are provided on the gate insulating film 230. At least a portion of the first active layer (A1) is overlapped with the first gate electrode (G1), and at least a portion of the second active layer (A2) is overlapped with the second gate electrode (G2).

Referring to one aspect of the present disclosure, the first active layer (A1) and the second active layer (A2) may be formed by an etching process using a halftone mask 610.

FIGS. 14B to 14E respectively show steps for the etching process using the halftone mask 610.

In detail, referring to FIG. 14, an oxide semiconductor material layer 30 is provided on the gate insulating film 230, and a photoresist layer 510 is disposed on the oxide semiconductor material layer 30. Also, the halftone mask 610 is disposed above the photoresist layer 510. The halftone mask 610 includes a light blocking portion 611, a transmitting portion 612, and a semi-transmitting portion 613.

The halftone mask 610 is disposed while being spaced apart from the photoresist layer 510, and light (L1) is irradiated thereonto through the halftone mask 610, whereby a selective exposure for the photoresist layer 510 is performed.

Figure 14A:
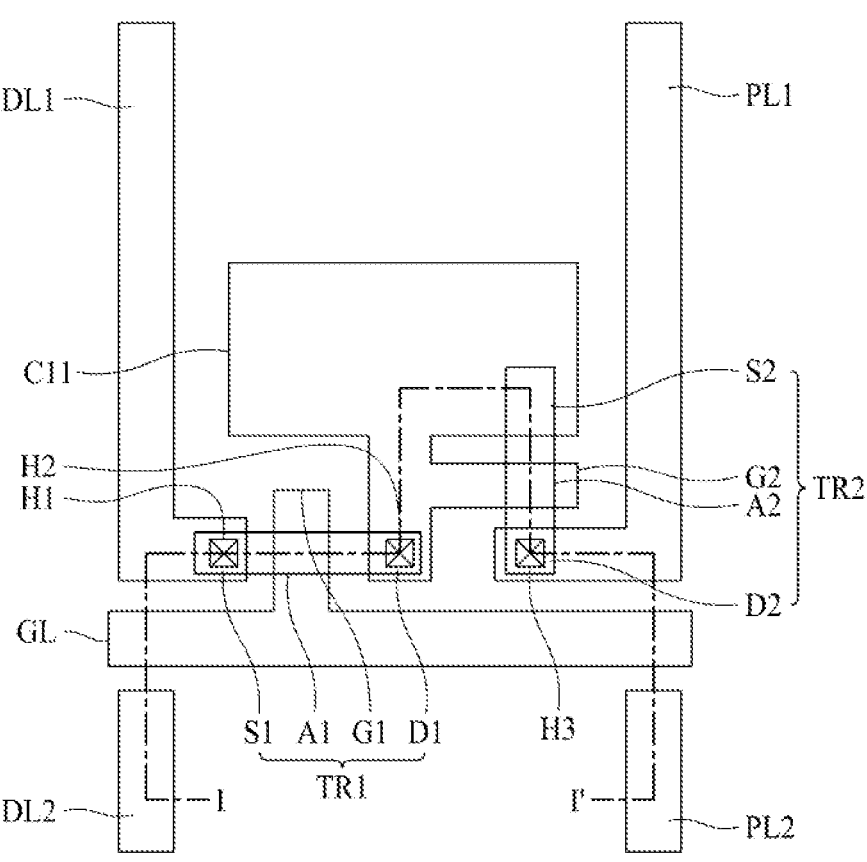
Figure 14B:
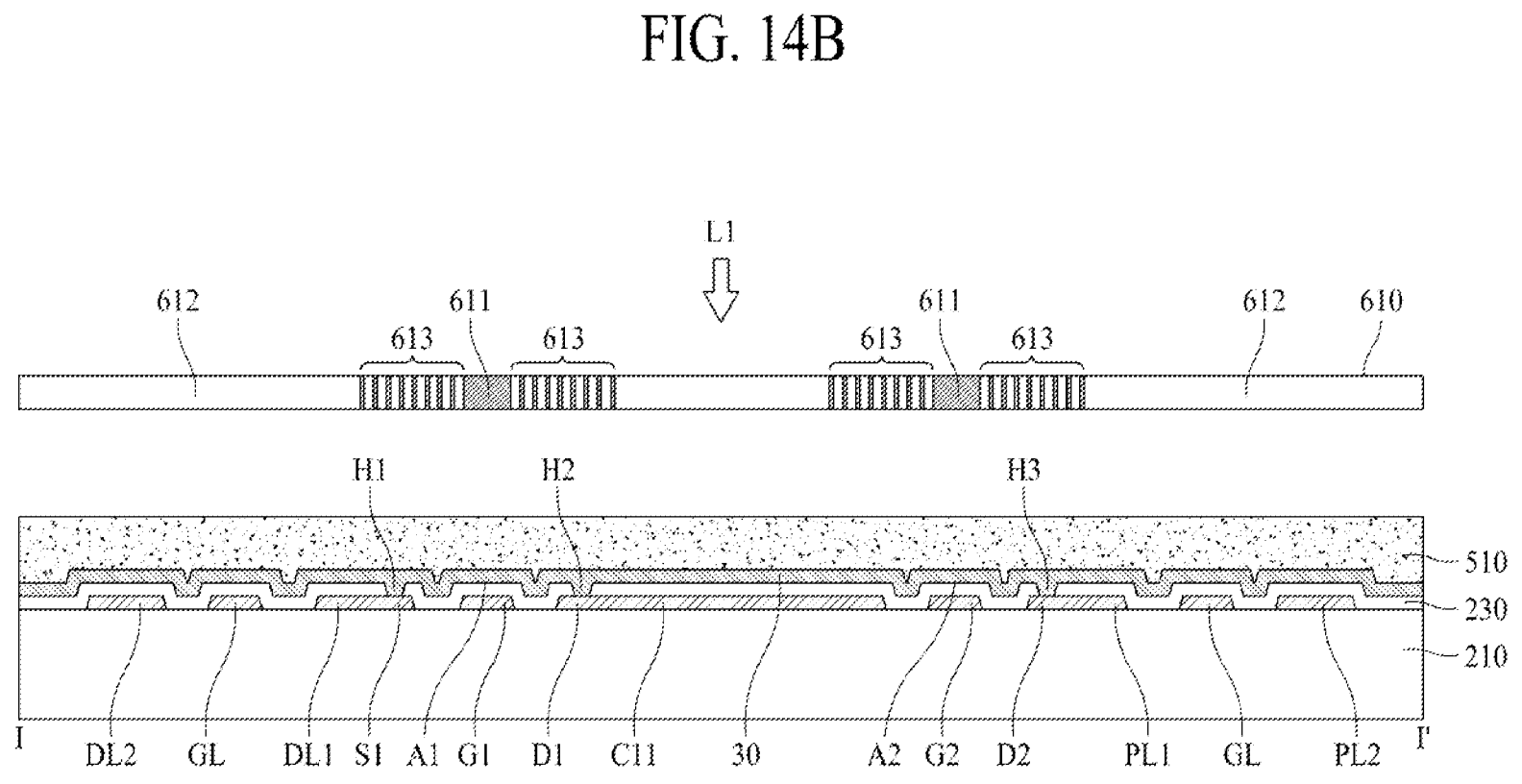
Figure 14C:
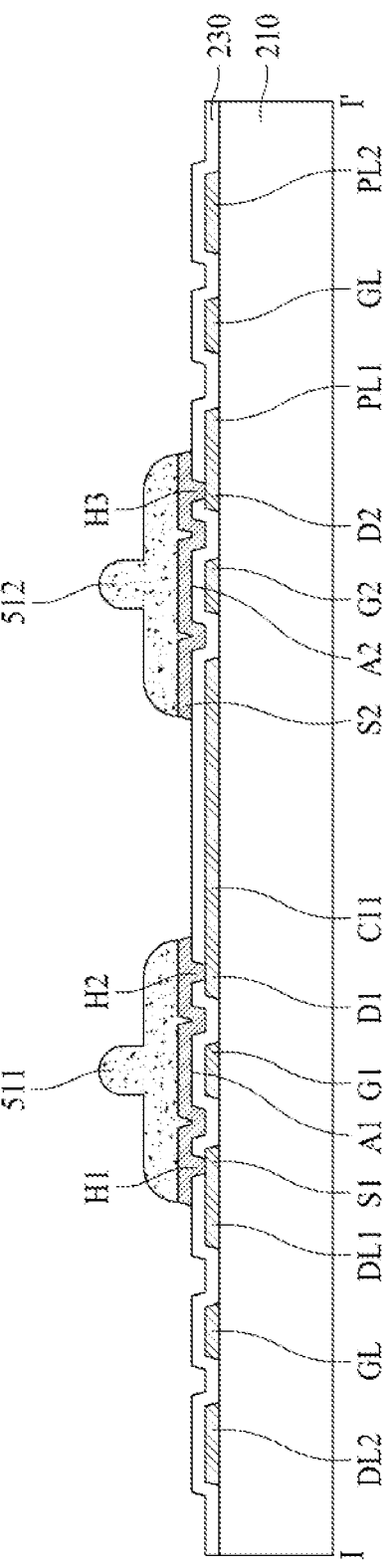

Referring to FIG. 14C, the selectively-exposed photoresist layer 510 is developed, to thereby form a plurality of photoresist patterns 511 and 512. Also, the oxide semiconductor material layer 30 is patterned by an etching process using the photoresist pattern 511 and 512 as a mask, to thereby form the first active layer (A1) and the second active layer (A2).

Figure 14D:
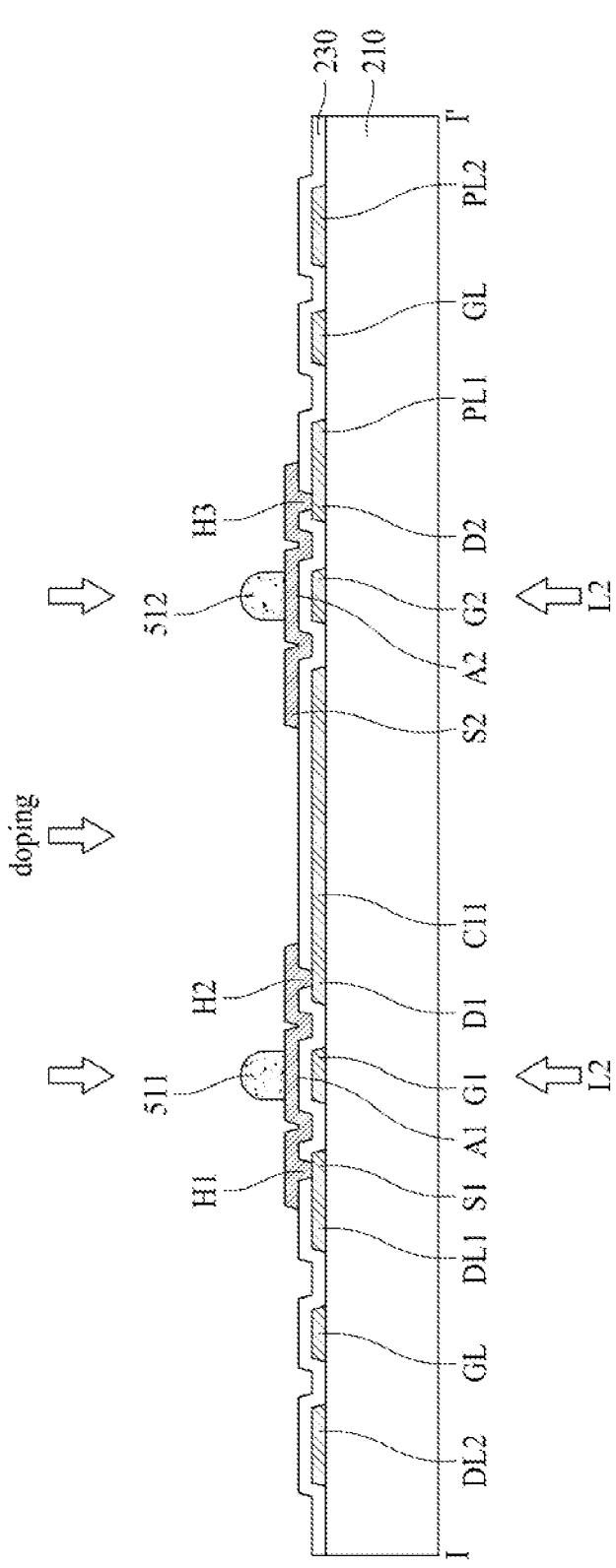

Referring to FIG. 14D, the photoresist pattern 511 and 512 is additionally ashed so that the photoresist pattern 511 and 512 remains only above the channel region 33 of the first active layer (A1) and the second active layer (A2), and the other portions of the first active layer (A1) and the second active layer (A2) are exposed. Under these conditions, some portions of the first active layer (A1) and the second active layer (A2) may be selectively provided with conductivity to be conducting regions.

The above step for selectively providing conductivity to the first active layer (A1) and the second active layer (A2) to make the conducting regions in the first active layer (A1) and the second active layer (A2) may include a doping process using dopant.

For example, some regions of the first active layer (A1) and the second active layer (A2) may be selectively provided with conductivity, and thus become the conducting regions. In this case, doped regions become the conducting regions, to thereby provide the conducting region 32 and 33. For the doping process, at least one of boron (B) ion, phosphorous (P) ion, and fluorine (F) ion may be used.

However, one aspect of the present disclosure is not limited to the above. Herein, a region of the first active layers (A1) and a region of the second active layer (A2) may be provided with conductivity to be the conducting regions by a dry etching process, or a photo irradiation process.

For example, as shown in FIG. 14, ultraviolet ray (L2) is irradiated onto the substrate 210, whereby some regions of the first and second active layers (A1, A2), which are not overlapped with the first and second gate electrodes (G1, G2), may be the conducting regions. If ultraviolet ray (L2) is irradiated onto the substrate 210, the first and second gate electrodes (G1, G2) function as a mask for blocking ultraviolet ray, whereby the other regions of the first and second active layers (A1, A2), which are overlapped with the first and second gate electrodes (G1, G2), are not provided with conductivity, and become the regions having the semiconductor properties. As a result, the regions of the first and second active layers (A1, A2), which are overlapped with the first and second gate electrodes (G1, G2), may be the channel region 31.

Figure 14E:
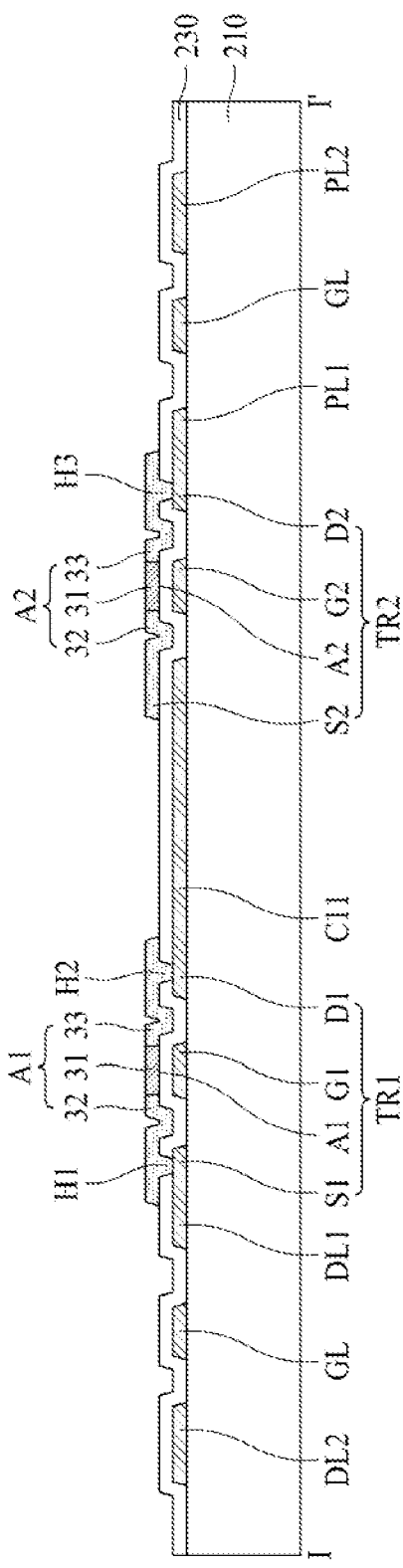

As a result, as shown in FIG. 14E, it is possible to provide the first active layer (A1) and the second active layer (A2) which respectively have the channel region 31 and the conducting region 32 and 33.

Figure 15A:
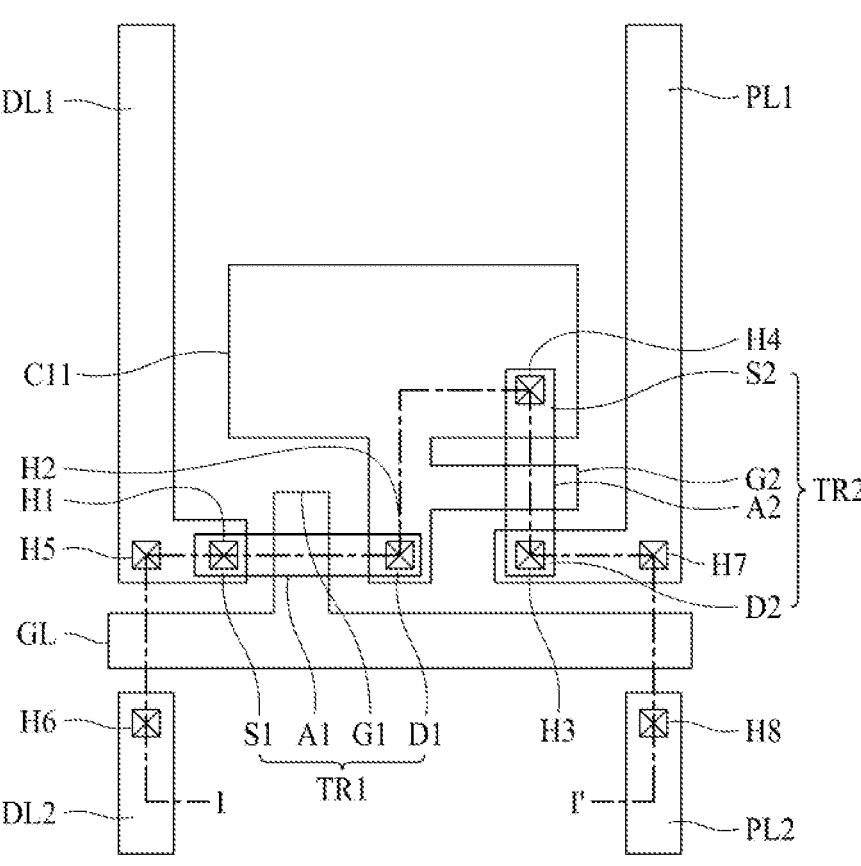
FIGS. 15A and 15B are respectively a plan view and a cross sectional view for a manufacturing process of the display apparatus according to one aspect of the present disclosure.
Figure 15B:
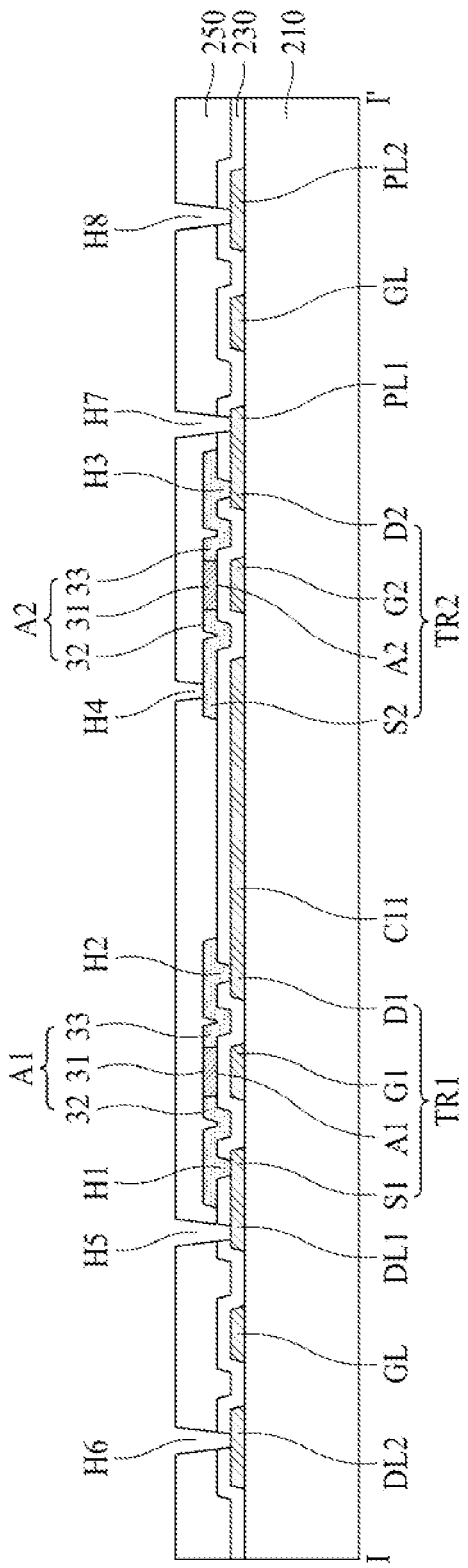

Then, referring to FIGS. 15A and 15B, the protection layer 250 is provided on the first active layer (A1) and the second active layer (A2). The fourth contact hole (H4), the fifth contact hole (H5), the sixth contact hole (H6), the seventh contact hole (H7), and the eighth contact hole (H8) are formed in the protection layer 250.

The fourth contact hole (H4) penetrates through the protection layer 250. The fifth contact hole (H5), the sixth contact hole (H6), the seventh contact hole (H7), and the eighth contact hole (H8) penetrate through the protection layer 250 and the gate insulating film 230. For the formation of the contact holes (H4, H5, H6, H7 and H8), a mask process is carried out.

Figure 16A:
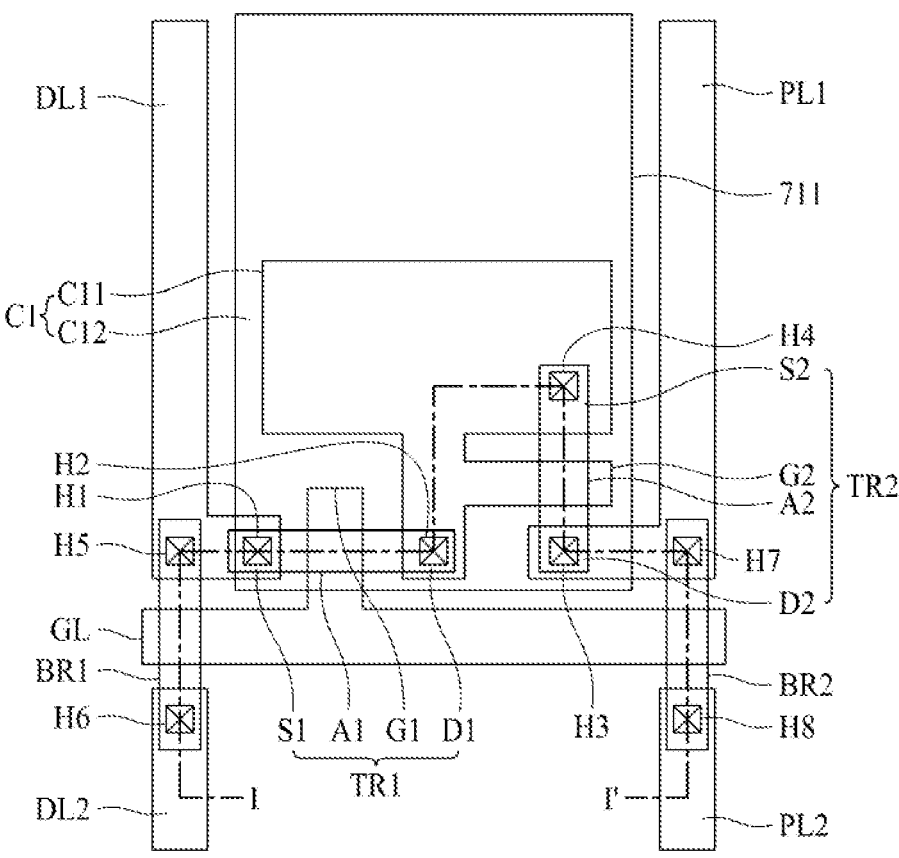
FIGS. 16A, 16B, 16C, 16D and 16E are respectively a plan view and cross sectional views for a manufacturing process of the display apparatus according to one aspect of the present disclosure.
Figure 16B:
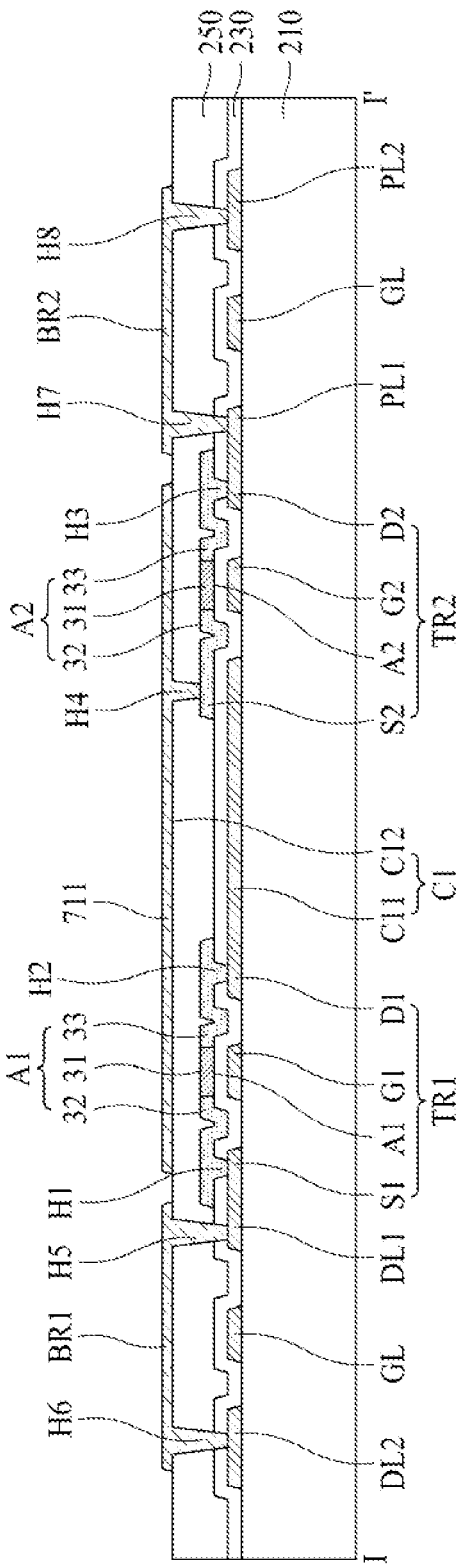

Then, referring to FIGS. 16A and 16B, the first connection electrode (BR1) is provided on the protection layer 250, and the first connection electrode (BR1) is disposed on the same layer as that of the first electrode 711 of the display device 710. Also, the second connection electrode (BR2) is disposed on the protection layer 250.

The first electrode 711 of the display device 710 is connected with the second active layer (A2). In detail, the first electrode 711 of the display device 710 is connected with the second source electrode (S2) via the fourth contact hole (H4), whereby the first electrode 711 of the display device 710 may be electrically connected with the second active layer (A2).

The first connection electrode (BR1) is disposed on the same layer as the first electrode 711, and the first connection electrode (BR1) is connected with the first portion (DL1) and second portion (DL2) of the data line (DL) corresponding to the second signal line via the contact hole (H5, H6). In detail, the first connection electrode (BR1) is connected with the first portion (DL1) and second portion (DL2) of the data line (DL) via the fifth contact hole (H5) and sixth contact hole (H6) penetrating through the protection layer 250 and the gate insulating film 230.

The second connection electrode (BR2) is disposed on the same layer as that of the first electrode 711, and the second connection electrode (BR2) is connected with the first portion (PL1) and second portion (PL2) of the driving power line (PL) corresponding to the third signal line via the seventh contact hole (H7) and eighth contact hole (H8).

The first connection electrode (BR1) and the second connection electrode (BR2) are formed of the same material as that of the first electrode 711. The first connection electrode (BR1) and the second connection electrode (BR2) may be manufactured together with the first electrode 711 by the same mask process.

Figure 16C:
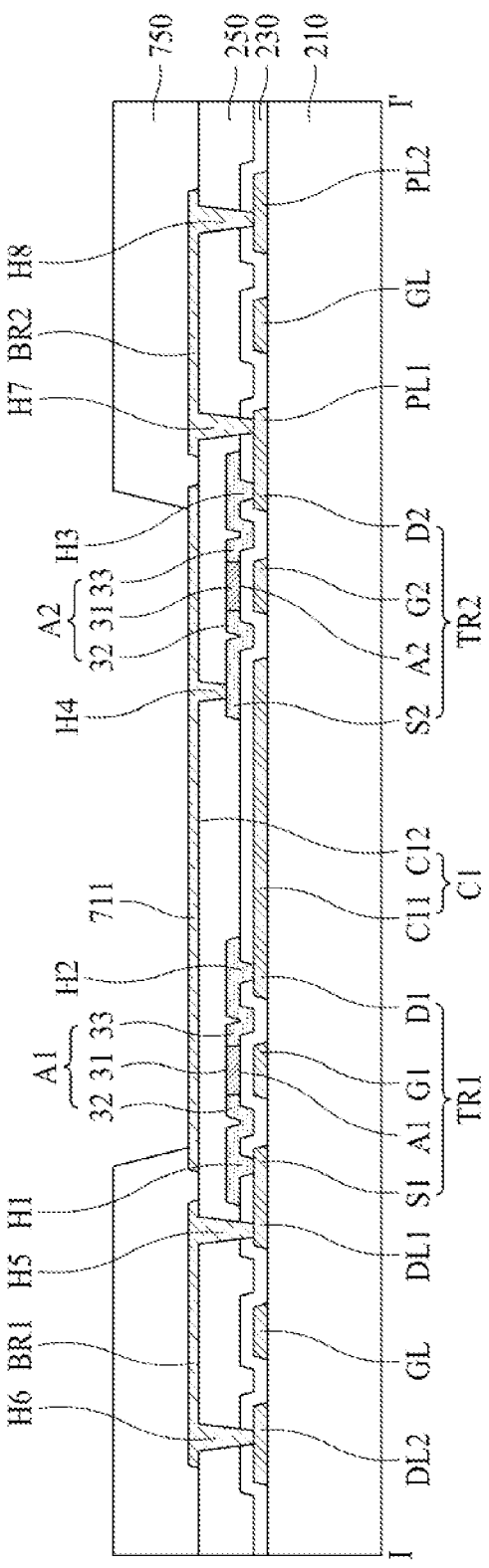

Referring to FIG. 16C, the bank layer 750 is disposed on the periphery of the first electrode 711. The bank layer 750 defines the emission area of the display device 710.

Figure 16D:
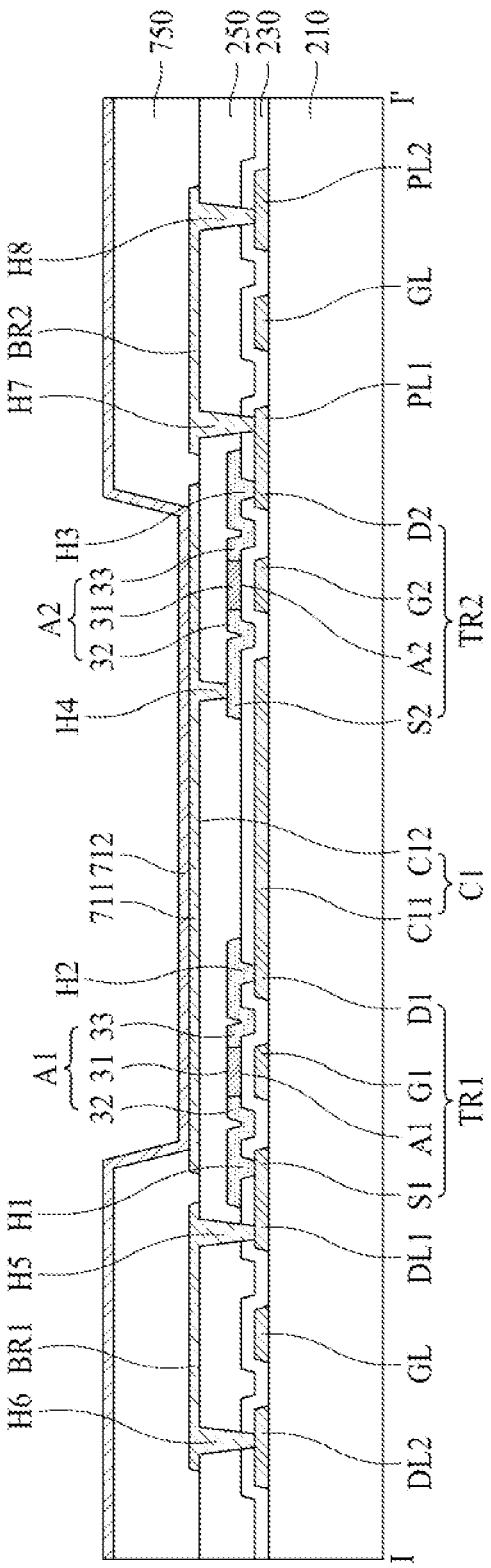

Referring to FIG. 16D, the emission layer 712 is disposed on the first electrode 711. Herein, the emission layer 712 is the organic emission layer including the organic material.

Figure 16E:
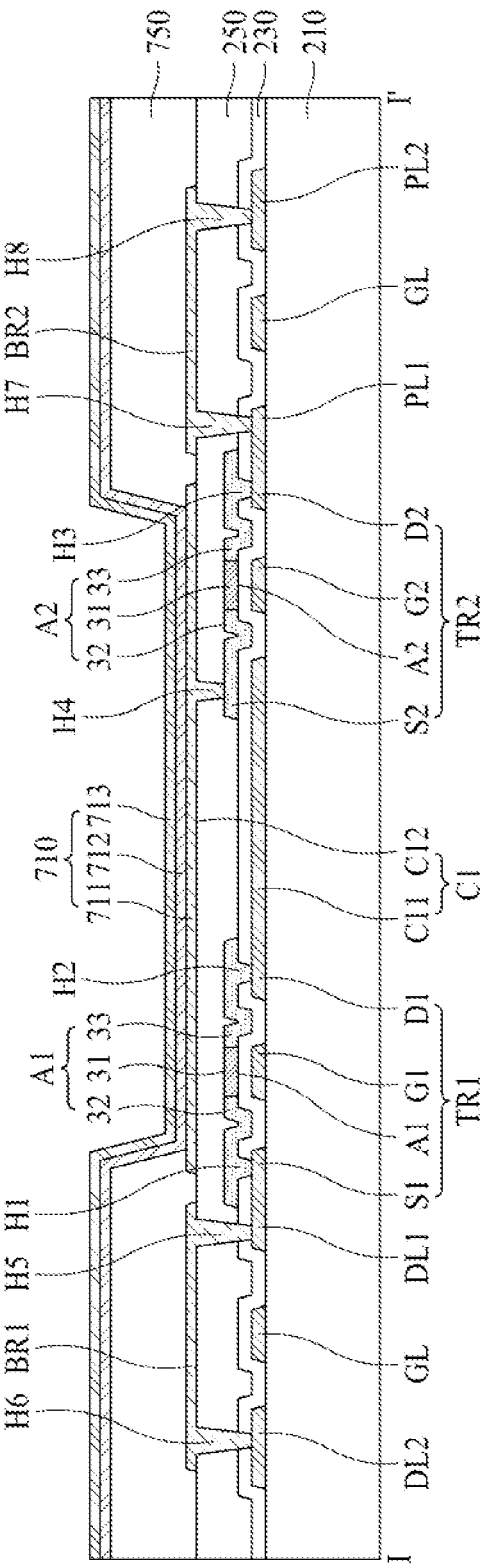

Referring to FIG. 16E, the second electrode 713 is disposed on the emission layer 712. Accordingly, it is possible to complete the display device 710.

According to one aspect of the present disclosure, the first gate electrode (G1) is connected with the gate line (GL) corresponding to the first signal line. Also, the first drain electrode (D1) is connected with the second gate electrode (G2). The first source electrode (S1) is connected with the data line (DL) corresponding to the second signal line.

Also, referring to FIG. 6, the process of forming the first electrode 711 and the first connection electrode (BR1) may include steps of forming the transparent conductive oxide (TCO) layer on the protection layer 250, forming the metal layer on the TCO layer, and patterning the TCO layer and the metal layer. The metal layer is removed from the area of the first electrode 711 of the display device 710.

In more detail, the first electrode 711 of the display device 710, the first connection electrode (BR1), and the second connection electrode (BR2) shown in FIG. 6 may be manufactured at the same time by the patterning process using the halftone mask. For example, the first layer of the transparent conductive oxide material and the second layer of the metal material are sequentially provided on the protection layer 250, and the patterning process using the halftone mask is carried out so that only the layer of the transparent conductive oxide material remains in the area of the first electrode 711 of the display device 710, and both the layer of the transparent conductive oxide material and the layer of the metal material remain in the area of the first connection electrode (BR1) and the second connection electrode (BR2).

According to one aspect of the present disclosure, the signal lines are provided in the same layer, and it is unnecessary to provide an additional light shielding layer for protecting the oxide semiconductor layer so that it is possible to simplify a structure of the display apparatus, and also to simplify a manufacturing process of the display apparatus.

According to one aspect of the present disclosure, the conducting regions of the oxide semiconductor layer formed by the selective conductivity providing process of the oxide semiconductor layer serve as the connection region between the signal line and the oxide semiconductor layer so that it is unnecessary to provide a process for forming additional source and drain electrodes. Thus, in case of the manufacturing process of the display apparatus according to one aspect of the present disclosure, an additional mask process for forming the source and drain electrodes of the thin film transistor is not required so that it is possible to simplify a structure of the display apparatus, and also to simplify a manufacturing process of the display apparatus.

It will be apparent to those skilled in the art that the present disclosure described above is not limited by the above-described aspects and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A method for manufacturing a display apparatus comprising:

providing a first signal line, a first gate electrode, a first source electrode, a first drain electrode, a second gate electrode, a second drain electrode, and a first portion and a second portion of a second signal line on a substrate;

providing a gate insulating film on the first signal line, on the first gate electrode, on the first source electrode, on the first drain electrode, on the second gate electrode, on the second drain electrode, and on the first portion and the second portion of the second signal line, wherein the gate insulating film is provided after forming the first signal line, the first gate electrode, the first source electrode, the first drain electrode, the second gate electrode, the second drain electrode, and the first portion and the second portion of the second signal line;

providing a first active layer and a second active layer on the gate insulating film, wherein at least a portion of the first active layer is overlapped with the first gate electrode, and at least a portion of the second active layer is overlapped with the second gate electrode after forming the gate insulating film;

selectively providing conductivity to the first active layer and the second active layer to make conducting regions in the first active layer and the second active layer;

providing a protection layer on the first active layer and the second active layer; and providing a first connection electrode and a first electrode of a display device on the protection layer after forming the protection layer, wherein the first connection electrode connects the first portion of the second signal line with the second portion of the second signal line, wherein the first gate electrode is connected with one of the first signal line and the second signal line, one of the first source electrode and the first drain electrode is connected with the second gate electrode, another one of the first source electrode and the first drain electrode is connected with the other of the first signal line and the second signal line, and wherein the first active layer is disposed on the gate insulating film, and the first active layer contacts the first source electrode and the first drain electrode via contact holes formed in the gate insulating film.

2. The method according to claim 1, wherein the process of selectively providing conductivity to the first active layer and the second active layer includes a doping process using dopant.

3. The method according to claim 1, wherein the process of providing the first connection electrode and the first electrode of the display device includes:

providing a transparent conductive oxide (TCO) layer on the protection layer;

providing a metal layer on the transparent conductive oxide layer; and patterning the transparent conductive oxide layer and the metal layer, wherein the metal layer is removed from the area for the first electrode of the display device.

4. The method according to claim 1, wherein both the first source electrode and the first drain electrode are formed between the substrate and the first active layer.

5. The method according to claim 1, wherein one of the first signal line and the second signal line is a gate line, and another one of the first signal line and the second signal line is a data line.

6. The method according to claim 1, wherein one of the first source electrode and the first drain electrode is formed as one body with the second gate electrode.

7. The method according to claim 1, wherein the first active layer includes a channel region and a source region and a drain region connected with the channel region, wherein the source region contacts the first source electrode, and the drain region contacts the first drain electrode.

8. The method according to claim 7, wherein the source region and the drain region are formed when selectively providing conductivity to the first active layer and the second active layer.

9. The method according to claim 1, wherein the first connection electrode and the first electrode of the display device are formed at a same time by a same mask process.

10. The method according to claim 1, wherein the first connection electrode includes:

a transparent conductive oxide layer formed of a same material as the first electrode of the display device; and a metal layer disposed on the transparent conductive oxide layer.

11. The method according to claim 1, wherein the first gate electrode is formed between the substrate and the first active layer, and the second gate electrode is formed between the substrate and the second active layer.

12. The method according to claim 1, wherein each of the first active layer and the second active layer is formed by an oxide semiconductor material.

13. The method according to claim 1, further comprising forming a first capacitor electrode on a same layer as the second gate electrode.

14. The method according to claim 13, wherein the first capacitor electrode is formed as one body with the second gate electrode.

15. The method according to claim 13, wherein the first capacitor electrode is formed to overlap with the first electrode of the display device to form a first capacitor.

16. The method according to claim 13, further comprising forming a second capacitor electrode, a second source electrode and a second drain electrode, wherein the second capacitor electrode is connected with one of the second source electrode and the second drain electrode.

17. The method according to claim 16, wherein the second capacitor electrode is formed as one body with the second active layer.

18. The method according to claim 1, further comprising forming a third signal line intersecting with one of the first signal line and the second signal line, wherein the third signal line is a driving power line.

* * * * *